(12) United States Patent
Jung et al.

(10) Patent No.: US 8,335,101 B2
(45) Date of Patent: Dec. 18, 2012

(54) RESISTANCE-BASED MEMORY WITH REDUCED VOLTAGE INPUT/OUTPUT DEVICE

(75) Inventors: Seong-Ook Jung, San Diego, CA (US); Jisu Kim, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 244 days.

(21) Appl. No.: 12/691,252

(22) Filed: Jan. 21, 2010

(65) Prior Publication Data

US 2011/0176350 A1   Jul. 21, 2011

(51) Int. Cl.
  *G11C 11/00* (2006.01)
(52) U.S. Cl. ........ 365/148; 365/158; 365/163; 365/207; 365/210.1; 365/227
(58) Field of Classification Search ...... 365/46
  See application file for complete search history.

(56) References Cited

U.S. PATENT DOCUMENTS

| | | | |
|---|---|---|---|
| 7,885,116 B2* | 2/2011 | Pasotti et al. ........ | 365/185.18 |
| 7,889,585 B2* | 2/2011 | Jung et al. .......... | 365/207 |
| 8,094,480 B2* | 1/2012 | Tonomura ........... | 365/148 |
| 8,228,714 B2* | 7/2012 | Davierwalla et al. ... | 365/158 |
| 2003/0080780 A1 | 5/2003 | Okamoto et al. | |
| 2004/0052108 A1 | 3/2004 | Hidaka et al. | |
| 2004/0057280 A1 | 3/2004 | Ooishi | |
| 2004/0095825 A1 | 5/2004 | Tanizaki et al. | |
| 2004/0170048 A1 | 9/2004 | Hsu | |
| 2006/0104136 A1 | 5/2006 | Gogl et al. | |
| 2007/0159894 A1 | 7/2007 | Huber et al. | |
| 2008/0310218 A1 | 12/2008 | Hachino | |
| 2009/0323405 A1 | 12/2009 | Jung et al. | |
| 2010/0061144 A1* | 3/2010 | Davierwalla et al. ... | 365/158 |

FOREIGN PATENT DOCUMENTS

| | | |
|---|---|---|
| EP | 04412335 A1 | 8/1991 |
| EP | 0610927 A2 | 8/1994 |
| EP | 1074993 A1 | 2/2001 |
| WO | WO2008109768 | 9/2008 |

OTHER PUBLICATIONS

International Search Report and Written Opinion—PCT/US2011/021974, ISA/EPO—May 3, 2011.

* cited by examiner

*Primary Examiner* — Tan T. Nguyen
(74) *Attorney, Agent, or Firm* — Sam Talpalatsky; Nicholas J. Pauley; Jonathan T. Velasco

(57) ABSTRACT

A resistance-based memory with a reduced voltage I/O device is disclosed. In a particular embodiment, a circuit includes a data path including a first resistive memory cell and a first load transistor. A reference path includes a second resistive memory cell and a second load transistor. The first load transistor and the second load transistor are input and output (I/O) transistors adapted to operate at a load supply voltage similar to a core supply voltage of a core transistor within the circuit.

53 Claims, 16 Drawing Sheets

RESISTANCE-BASED MEMORY WITH REDUCED VOLTAGE INPUT/OUTPUT DEVICE

FIELD

The present disclosure is generally related to a resistance based memory device.

DESCRIPTION OF RELATED ART

It is desirable to continue to increase the density of magnetoresistive random access memory (MRAM) devices such as spin torque transfer MRAM (STT-MRAM) to produce MRAM devices that have increasingly large data storage capacities in increasingly smaller semiconductor devices. Reducing the size of MRAM devices calls for reducing the supply voltage to the MRAM devices. Reducing the supply voltage may reduce MRAM devices' power consumption and heat generation. However, reducing the supply voltage also may reduce the available sensing margin in distinguishing between stored high data values and stored low data values representing logical ones and zeroes, respectively.

Reducing the size of MRAM devices also tends to increase the effect of process variations in the manufacture of such devices. As a result, expected values of operational parameters, such as the sensing margin, may change. Thus, reducing the size of MRAM devices results may result in a reduced sensing margin that may be further reduced or varied by process variations in manufacturing the MRAM devices.

SUMMARY

Sensing margin is improved by using an input and output (I/O) transistor device as a sense amplifier load device under core voltage conditions. The increased size of the I/O load device reduces the effects of process variations on threshold voltage, which in turn reduces a variation of sensing margin to improve a mean–3σ noise margin for a device. A threshold voltage of the I/O load devices can be reduced for low-voltage operation by ion implantation, body bias effects, or a combination of both.

In a particular embodiment, a circuit comprises a data path including a first resistive memory cell and a first load transistor. A reference path includes a second resistive memory cell and a second load transistor. The first load transistor and the second load transistor are input and output (I/O) transistors adapted to operate at a load supply voltage similar to a core supply voltage of a core transistor within the circuit.

In another particular embodiment, a memory device is disclosed that includes a circuit including a data path and a reference path. The data path includes a first resistive memory cell that is accessed by one or more of a plurality of core transistors and that generates a data signal via a first load transistor. The reference data path includes a second resistive memory cell that is accessed by one or more of the plurality of core transistors and that generates a reference signal via a second load transistor. The first load transistor and the second load transistor each have a first length that is longer than a length of a representative core transistor of the plurality of core transistors. The circuit is configured to adapt the first load transistor and the second load transistor to operate at a supply voltage of the plurality of core transistors and to operate at a reduced threshold voltage. The memory device also comprises a sense amplifier circuit. The sense amplifier circuit has a first input to receive the data signal from the data path and has a second input to receive the reference signal from the reference path.

In still another particular embodiment, an apparatus is disclosed that includes a memory device. The memory device includes means for providing a data voltage from a first resistive memory cell via a first load transistor. The memory device also includes means for providing a reference voltage from a second resistive memory cell via a second load transistor. The memory device includes means for operating the first load transistor and the second load transistor at a load supply voltage similar to a core supply voltage of a core transistor within the memory device.

In another particular embodiment, a method of sensing data value stored at a resistance based memory is disclosed. A data signal is generated from a data cell including a first resistance based memory element via a first load transistor. The first load transistor has a first length that is longer than a length of a representative core transistor included in a resistance based memory. The first load transistor is configured to operate at a same supply voltage as the representative core transistor. A reference signal is generated from a reference circuit including a second resistance based memory element via a second load transistor. The second load transistor has a second length that is longer than the length of the representative core transistor. The second load transistor is configured to operate at the same supply voltage as the representative core transistor. A pair of signals is received at a sense amplifier where the pair of signals includes a data signal from the first load transistor and a reference signal from the second load transistor.

One particular advantage provided by embodiments disclosed herein enables accurate reading of stored data values. By increasing the sensing margin of a memory device, data may be read from the memory device with fewer read errors that may result when the sensing margin is too small to differentiate high and low data values. By reducing variation of the sensing margin of data storage elements in memory devices resulting from process variations, device yield can be improved and manufacturing costs can be reduced.

Another particular advantage provided by embodiments disclosed herein provides more accurate reading of data values enabled by using input and output (I/O) transistors operating at a lower supply voltage than at which I/O transistors usually operate. Using I/O transistors, even at a reduced supply voltage, may have improved sensing margins as compared to using core transistors. Adjusting the threshold voltage as a result of an implantation or a forward bias voltage may further improve the sensing margin.

Other aspects, advantages, and features of the present disclosure will become apparent after review of the entire application, including the following sections: Brief Description of the Drawings, Detailed Description, and the Claims.

DETAILED DESCRIPTION

In a particular illustrative embodiment, input and output (I/O) load transistors are used in a magnetoresistive memory device in place of using core transistors as load transistors to improve the sensing margin of the memory device. I/O load transistors generally have a longer channel length ("length") than a core transistor. I/O transistors also generally will have a higher supply voltage, a higher threshold voltage, and a higher output resistance than a core transistor, but have a lower current than a core transistor.

Using core load transistors may result in large variations in sensing margin as a result of process variations in manufacture. A variation in transistors may generally be proportional to the square root of the channel width ("width") multiplied by the length. For a core transistor, the width multiplied by the length is typically small and, thus, subject to wider proportional variation in manufacture. To provide the same current as a core transistor, an I/O transistor will be larger. Thus, the length multiplied by the width of the I/O transistor will be larger than that for a core transistor having an equivalent current, thus the proportional variation in manufacture of I/O transistors will be considerably small than for core transistors. In addition, because of the higher output resistance of I/O transistors, using I/O load transistors instead of core load transistors results in an improved sensing margin. Although the threshold voltage for an I/O transistor is higher than the threshold voltage of a core transistor and may limit the sensing margin, the threshold voltage may be adjusted to improve the available sensing margin.

Figure 1:
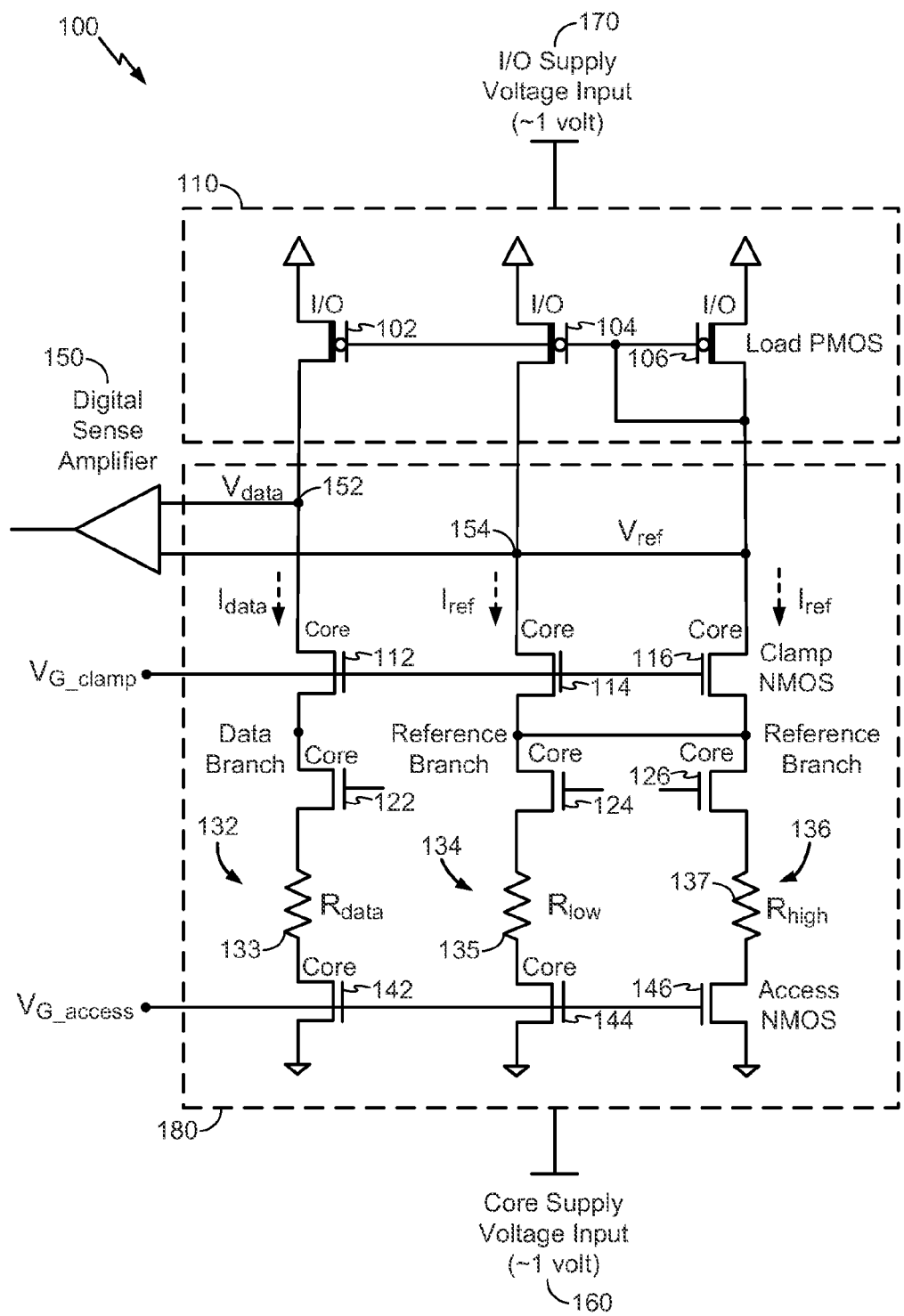
FIG. 1 is a schematic diagram of sensing circuit 100 for a resistance-based dynamic random access memory (MRAM) device employing input and output (I/O) load transistors, particularly, positive-channel metal oxide semiconductor (PMOS) I/O load transistors 102, 104, 106 according to an illustrative embodiment of the present invention.

FIG. 1 is a schematic diagram of sensing circuit 100 for a resistance-based, spin torque transfer magnetoresistive random access memory (STT-MRAM) device employing input and output (I/O) load transistors, particularly, positive-channel metal oxide semiconductor (PMOS) I/O load transistors 102, 104, 106 according to an illustrative embodiment of the present disclosure. The I/O load transistors 102, 104, 106 serve as part of a first-stage analog sense amplifier 110 that drives inputs of the digital sense amplifier 150.

According to a particular illustrative embodiment, the I/O load PMOS transistors 102, 104, 106 replace an equal number of core transistors that may be used as load transistors. The core transistors replaced by the I/O load PMOS transistors are similar to core transistors 112, 114, 116 used as current clamp devices, core transistors 122, 124, 126 used on bit lines to access output of resistive memory cells 132, 134, 136, or core transistors 142, 144, 146 used in memory cells 132, 134, 136. Each of the MRAM cells 132, 134, 136 includes a resistive data storage element ($R_{data}$) 133, 135, 137, respectively, that is used to maintain a data value. Each of the memory cells 132, 134, 136 also includes a core transistor 142, 144, 146, respectively, to access the data value maintained by the resistive data storage element 133, 135, 137, respectively.

As explained below, the use of the I/O load transistors 102, 104, 106 improves the sensing margin between a data path, including a first resistive memory cell 132 and a reference path including a second resistive memory cell 134 and a third resistive memory cell 136. The first resistive memory cell 132 is coupled to a first I/O load PMOS transistor 102 and the second resistive memory cells 134 and 136 are coupled to second I/O load PMOS transistors 104 and 106. The data path is coupled to a data voltage ($V_{data}$) node 152 of a digital sense amplifier 150 and the reference path is coupled to reference voltage ($V_{ref}$) node 154. Improving the sensing margin between the data voltage node 152 and the voltage reference node 154 improves the accuracy of the digital sense amplifier 150 in reading stored data values.

The I/O load PMOS transistors 102, 104, 106, as described below with reference to FIG. 3, have a longer Length L' 380 and may accommodate a higher supply voltage as compared to a core supply voltage used to power core transistors 112-116, 122-126, 132-136. For example, core transistors such as transistors 112, 114, 116 used as current clamp devices and transistors 122, 124, 126 and 142, 144, 146 used to access the memory cells 132, 134, 136 operate at a supply voltage of 1.0 volts or less. By contrast, the I/O load transistors 102, 104, 106 operate at supply voltages of 1.8 volts. As further explained below, the use of I/O load transistors 102, 104, 106 improves the sensing margin of the digital sense amplifier 150. Further, the I/O load transistors 102, 104, 106 are configured to operate at lower than usual supply voltages, such as a supply voltage of 1.0 volt, to improve the sensing margin while reducing power requirements. I/O load transistors such as transistors 102, 104, 106 typically operate at a supply voltage of up to 1.8 volts. However, as described below, operating the I/O transistors 102, 104, 106 at a lower supply voltage provides advantages beyond merely saving power, particularly when a threshold voltage of the I/O transistors 102, 104, 106 is also reduced by device modifications.

Figure 2:
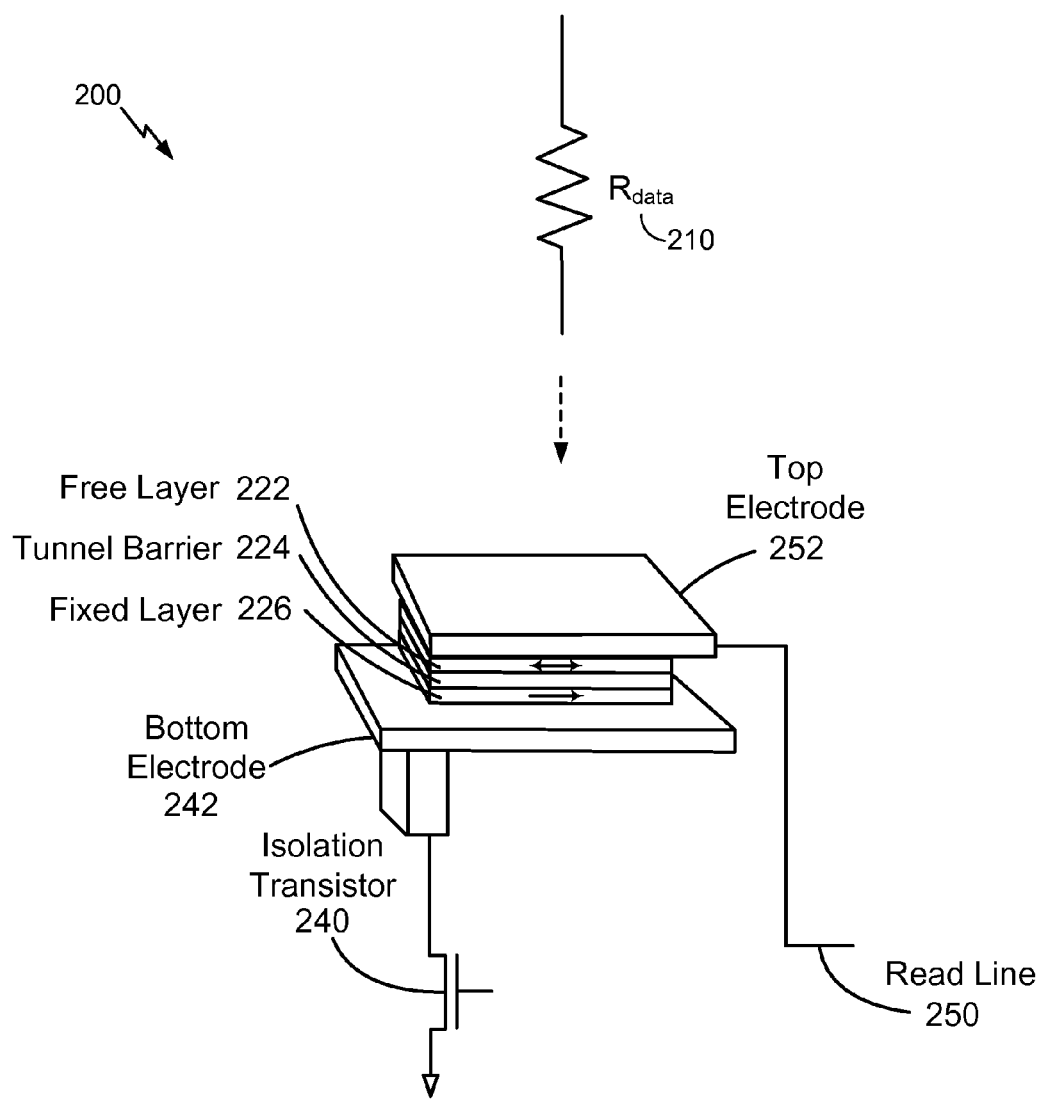
FIG. 2 is a perspective view of a resistive portion of a magnetic tunneling junction memory cell that provides a changeable resistance for use in a magnetoresistive memory device such as the resistive MRAM device of FIG. 1.

FIG. 2 is a perspective view of a resistive portion of a magnetic tunneling junction memory cell 200 that provides a changeable resistance for use in a magnetoresistive memory device such as the resistive MRAM device 100 of FIG. 1. An MRAM cell is represented by the resistor symbol 210 labeled $R_{data}$. According to an illustrative embodiment, the magnetic tunneling junction memory cell 200 stores a data bit by changing an orientation of a magnetic moment of a free layer 222 that abuts a tunnel barrier 224 and relative to a fixed magnetic moment of a fixed layer 226. The orientation of the magnetic moment of the free layer 222 is changed by changing the voltages applied to the bottom electrode 242 and the top electrode 252 when an isolation transistor 240 coupled to a write electrode 242 adjacent to the fixed layer 226 is activated. Changing the orientation of the magnetic moment of the free layer 222 results in a changed resistance that is readable at a read line 250 connected to the top electrode 252 adjacent to the free layer 222.

Figure 3:
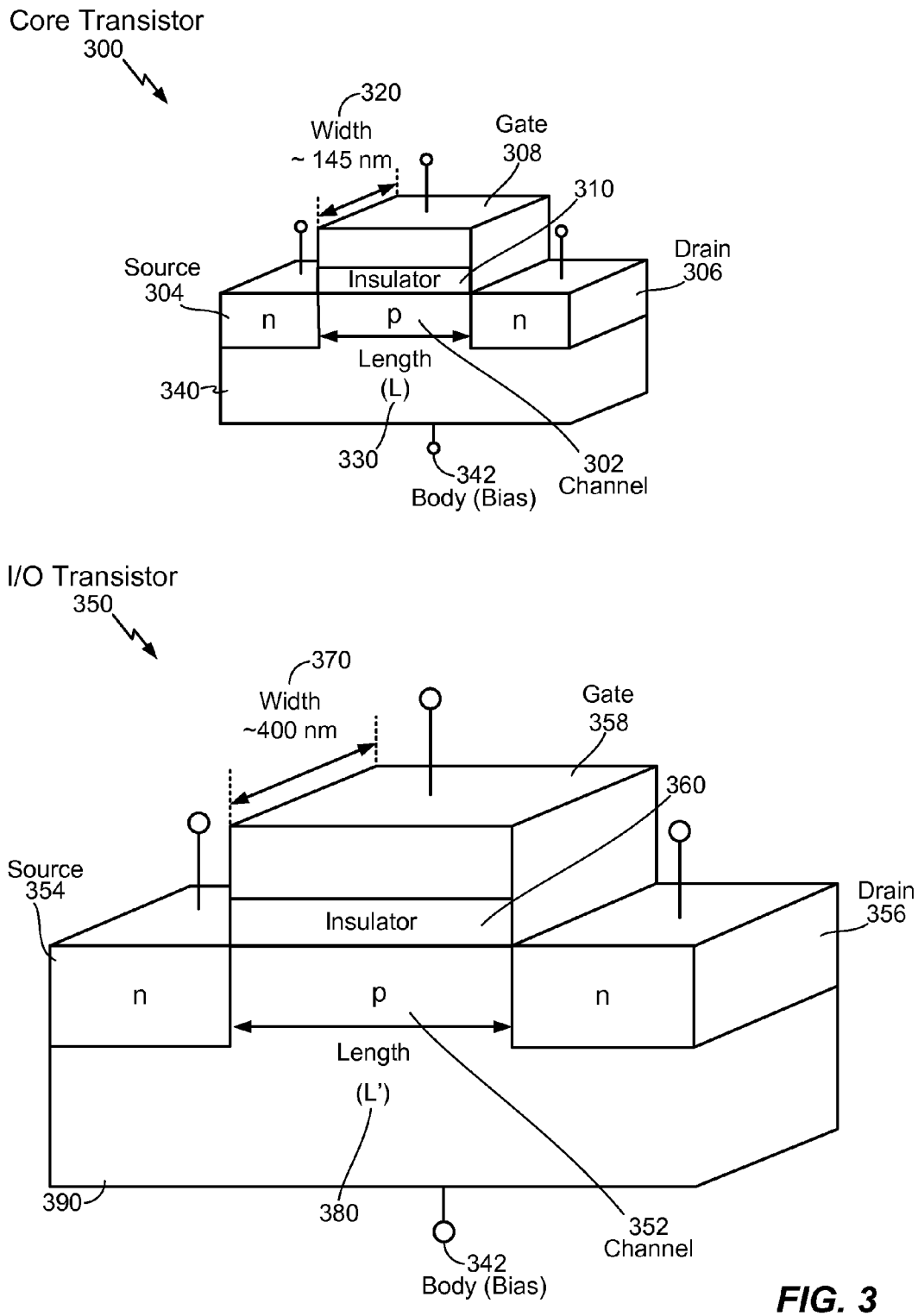
FIG. 3 is a pair of a perspective views of a PMOS core transistor and of a PMOS I/O transistor used in an illustrative embodiment of the present disclosure.

FIG. 3 is a pair of perspective views of a PMOS core transistor 300 and of a PMOS I/O transistor 350, respectively, used in an illustrative embodiment of the present disclosure. The PMOS core transistor 300 has a p-type channel 302 between an n-type source 304 and an n-type drain 306. A gate 308 is separated from the p-type channel 302 by an insulator layer 310. The p-type channel 302, the n-type source 304, the n-type drain 306, the gate 308, and the insulator layer 310 all have a width 320 of approximately 145 nanometers. The p-type channel 302 has a length 330 of L, which typically may be less than one-third of the width. A body 340 of p-type material is connected to a body bias terminal 342, the use of which is further described below.

The PMOS I/O transistor 350 is similar to the PMOS core transistor 300 except in the relative dimensions of the transistors 300 and 350. According to a particular embodiment, I/O transistors may be used that have a longer length than a core transistor. As previously described, an I/O transistor generally will have a higher supply voltage, a higher threshold voltage, and a higher output resistance than a core transistor. The PMOS I/O transistor 350 has a p-type channel 352 between an n-type source 354 and an n-type drain 356. A gate 358 is separated from the p-type channel 352 by an insulator layer 360. The p-type channel 352, the n-type source 354, the n-type drain 356, the gate 358, and the insulator layer 360 all have a width 370 of approximately 400 nanometers, which is nearly three times the width 320 of the core transistor 300. The p-type channel 352 of the I/O transistor 350 has a length L' 380, which is typically more than one-third of the width, or in a range of approximately 150 nanometers for an I/O transistor of a width of 400 nanometers. A body 390 of p-type material is connected to a body bias terminal 392. The use of the body bias terminal 392 is further described below.

The I/O transistor 350 has a larger relative length L' 380 as compared to the Length L 330 of the core transistor 300 and generally exhibits a higher threshold voltage than the core transistor 300. At the same time, the I/O transistor 350 is less sensitive to process variations due to its relatively larger dimensions of length L' 380 and width 370 as compared to the length L 330 and width 320 of the core transistor. Because of the larger dimensions of the I/O transistor, process variations will have a proportionally smaller effect on the current of the I/O transistor 350. As a result, a sensing circuit using the I/O transistor 350 instead of the core transistor 300 will be less affected by process variations that may affect the sensing margin of the circuit. Limiting the effect of process variations on sensing margins may result in fewer read errors than by reading data with a circuit using the core transistor 300.

Figure 4:
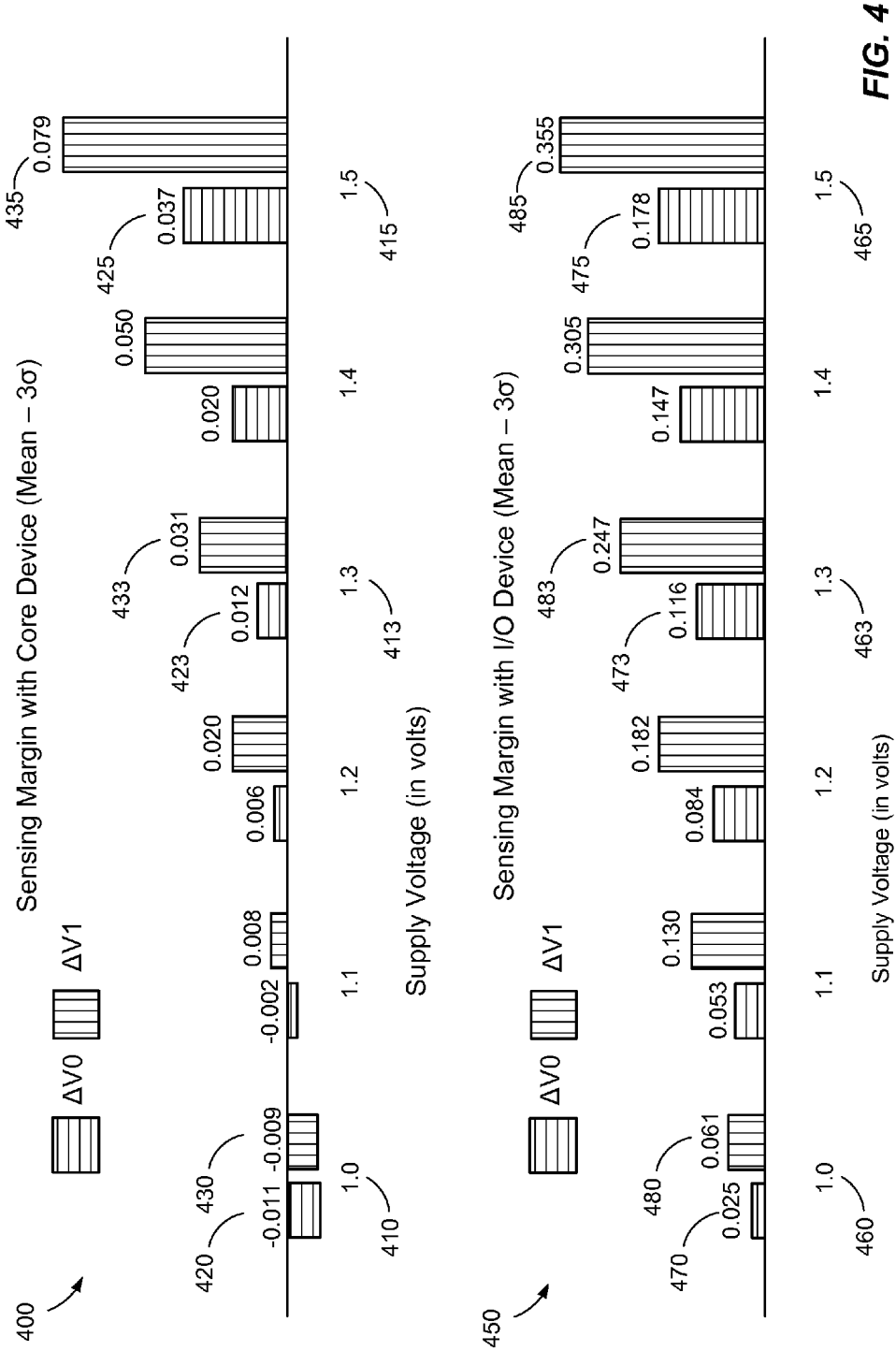
FIG. 4 is a pair of bar graphs of a sensing margin for a logical zero data value and a sensing margin for a logical one data value resulting from using a core transistor and an I/O transistor at a number of supply voltages between 1.0 volt and 1.5 volts.

FIG. 4 includes two bar graphs 400 and 450 of a sensing margin for a logical zero data value and a sensing margin for a logical one data value resulting from using a core transistor and an I/O transistor, respectively, as the load transistors 102, 104, 106 in the circuit of FIG. 1, while providing a range of supply voltages between 1.0 volt 410 and 1.5 volts 415 to the I/O supply voltage input 170 of the circuit 100 of FIG. 1. A sensing margin for a logical zero data value, $\Delta V0$, and a sensing margin for a logical one data value, $\Delta V1$, displayed in the graphs 400 and 450 are calculated using a mean minus three sigma (mean$-3\sigma$) method. Generally, $\Delta V0$ indicates a difference between a reference voltage and a voltage read from a memory cell storing a "0" value, and $\Delta V1$ indicates a difference between the reference voltage and a voltage read from the memory cell storing a "1" value. The sense margin is the smaller of $\Delta V0$ and $\Delta V1$, representing a maximum amount of noise beyond which the memory cell cannot be reliably read.

In the graph 400 showing the voltage margins for a core transistor, at the 1.0 volt supply voltage 410, $\Delta V0$ is $-0.011$ 420 and $\Delta V1$ is $-0.009$ 430. A negative sensing margin for a cell indicates that voltages representing logical zeroes and logical ones cannot be distinguished from each other. An inability to distinguish the output of a cell renders the cell unusable and, typically, results in the device containing the cell being discarded. However, as the supply voltage is increased, the voltage ranges and the resulting sensing margins also increase. For example, at a 1.3 volt supply voltage 413, $\Delta V0$ is 0.012 423 and $\Delta V1$ is 0.031 433, resulting in a larger sensing margin. At the 1.5 volt supply voltage 415, $\Delta V0$ is 0.037 425 and $\Delta V1$ is 0.079 435, resulting in a still larger sensing margin of 0.037 volts (V). However, although increasing the supply voltage increases the sensing margin for a core transistor, a core transistor having the relatively small dimensions as described with reference to FIG. 3 neither may be intended to nor desired to operate at a supply voltage as large as 1.5 volts. Operating core transistors at voltages as large as 1.5 volts may result in excessive heat generation and may damage the core transistors.

In the graph 450 showing the voltage margins for an I/O transistor, the voltage margins are higher at each of the supply voltages, resulting in larger sensing margins. For example, at a 1.0 volt supply voltage 460, $\Delta V0$ is 0.025 470 and $\Delta V1$ is 0.061 480. At a 1.3 volt supply voltage 463, $\Delta V0$ is 0.116 473 and $\Delta V1$ is 0.247 483. At a 1.5 volt supply voltage 465, $\Delta V0$ is 0.178 475 and $\Delta V1$ is 0.355 485 resulting in a sense margin of 0.178V. The larger voltage differentials $\Delta V0$ and $\Delta V1$ yielded by the I/O transistor result in larger sensing margins than are achievable using the core transistor.

Figure 5:
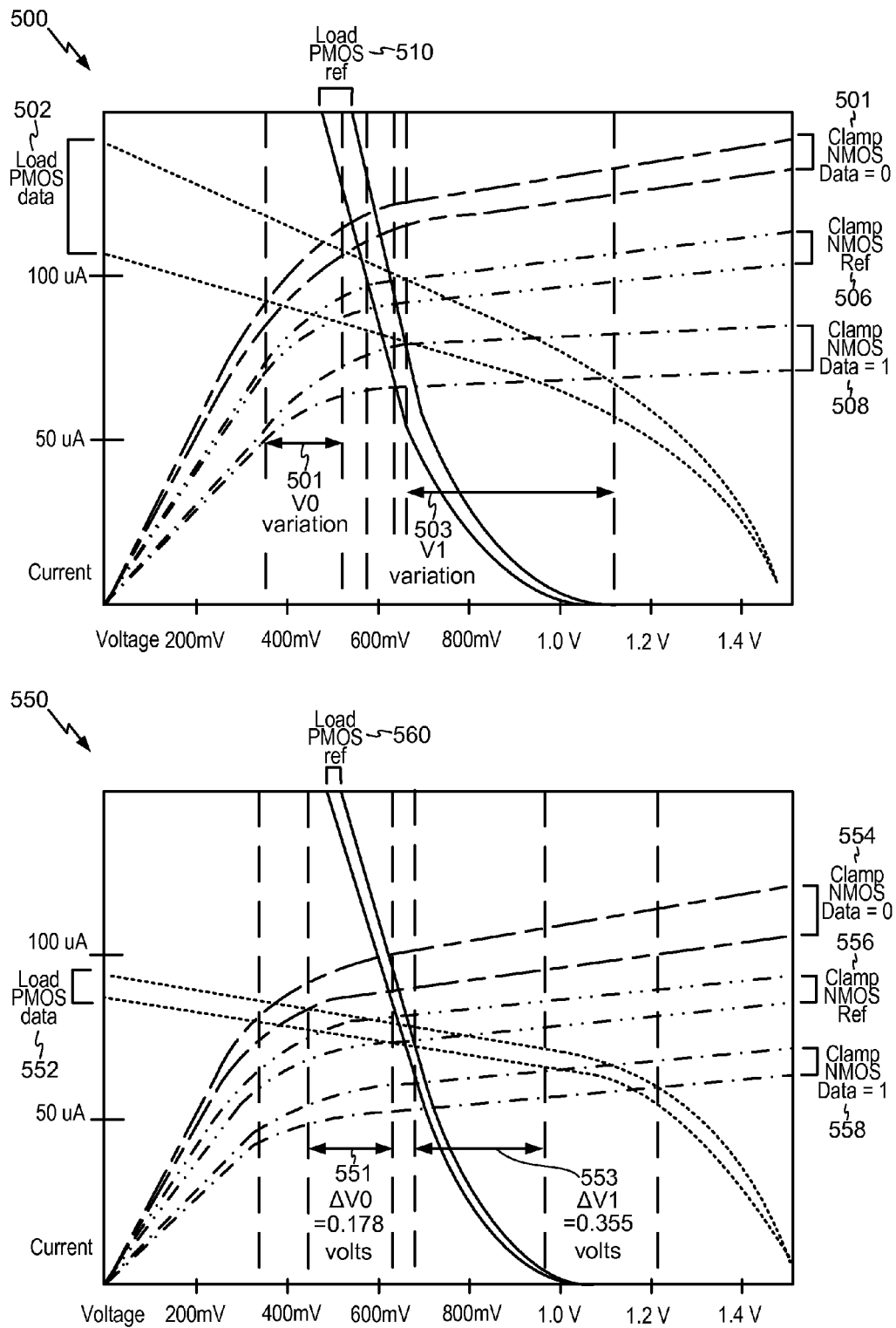
FIG. 5 is a pair of current/voltage graphs (I-V curves) illustrating how sensing margin varies with process variations for a core transistor and an I/O transistor at a supply voltage of 1.5 volts.

FIG. 5 includes two current/voltage graphs 500 and 550 illustrating how sensing margin varies with process variations for a core transistor and an I/O transistor, respectively, at a supply voltage of 1.5 volts. The graphs 500 and 550 are representative of results of a Monte Carlo simulation. In the graph 500, the current-voltage range ("I-V range") for the clamp NMOS core transistor with a data value of 0 (stored in memory cell 132 of FIG. 1) 504 and the I-V range for the clamp NMOS core transistor with a data value of 1 (stored in the memory cell 132 of FIG. 1) 508 are measured at $V_{data}$ 152 (FIG. 1). The I-V range 506 corresponds to the clamp NMOS core transistor at a reference voltage measured at node 154 (FIG. 1). The I-V range 502 corresponds to the load PMOS data transistor 502 measured using a core transistor (not shown) in place of the load I/O transistor at 102 (FIG. 1). The I-V range 510 for the load PMOS reference transistors 104, 106 (FIG. 1) is also depicted. The I-V ranges 502, 510 may be thought of the I-V ranges for the top-side circuit (the circuit 100 of FIG. 1) and the I-V ranges 504-508 may be thought of as the bottom-side circuit (the circuit 180 of FIG. 1).

The process variations that cause the variations in I-V ranges 502-510 cause variations in voltages representing a data value of 0 (V0 variation 501) and variations in voltages that represent a data value of 1 (V1 variation 503). The V0 variation 501 ranges across an intersection of the I-V range 502 with the I-V range 504. ΔV0 is equal to a voltage difference between a largest V0 value and a smallest Vref value, where the Vref value is given by the intersection of the load PMOS curve in the reference path and the clamp NMOS curve. The V1 variation 503 ranges across an intersection of the I-V range 502 with the I-V range 508. ΔV1 is equal to a voltage difference between a smallest V1 value and a largest Vref value. The sensing margin is the smaller of ΔV0 and ΔV1. The wide variation of the I-V range 502 is a predominant cause of the large V0 variation 501 and V1 variation 503, and the sensing margin may become unacceptably small as the I-V range 502 increases at lower supply voltages approaching 1 volt or less. Because of the small dimensions of core transistors (FIG. 3), process variations may have a pronounced effect on the operational characteristics of core transistors in generating an output of a memory cell.

The graph 550 of FIG. 5, by contrast, shows smaller sensitivity to process variations in current levels and voltage levels for an I/O transistor at a same supply voltage of 1.5 volts. An I-V range 552 for an I/O transistor exhibits lesser process variations than the comparable range 502 for a core transistor. Because of the significantly reduced I-V range 552 for the load PMOS data transistor 102 (FIG. 1), variation in V0 and V1 is reduced and as a result the sensing margin is improved. As illustrated, ΔV0 551 is increased to 0.178 volts and ΔV1 553 is increased to 0.355 volts. Use of I/O transistors 104 and 106 also reduces variation in the I-V range 560. Variations in an I-V range 554 for a data path measured at a core transistor, such as core NMOS transistor 112 used as clamp transistor, coupled to the memory cell 132 when the memory cell 132 stores a logical zero value, are reduced. Similarly, variations in an I-V range 558 for a data path measured at the core NMOS transistor 112 is coupled to the memory cell 132 when the memory cell 132 stores a logical one are reduced. Variations in an I-V range 556 for a data path measured at core transistors, such as core NMOS transistors 114, 116 used as clamp transistors for reference cells 134, 136 also are reduced. Thus, a sensing margin for the I/O transistor is greater than that for a core transistor at a supply voltage of 1.5 volts.

The I/O transistor tends to be less affected by process variations and tends to provide a better sensing margin than core transistors. However, in highly miniaturized circuits in which it may not be possible to provide higher supply voltages in the 1.5 volt range such as depicted in FIG. 4, the sensing voltage of I/O transistors is still relatively low. For example, at a supply voltage of one volt, the sensing margin is still low at a minimum of ΔV0 of 0.025 volts 470 (FIGS. 4) and ΔV1 of 0.061 volts 480. The low sensing margin may be increased, however, if the threshold voltage of the I/O transistor is effectively reduced. The relatively high threshold voltage of an I/O transistor limits the load current that may be applied and also limits the value of $V_{ref}$, both of which tend to reduce sensing margin.

Figure 6:
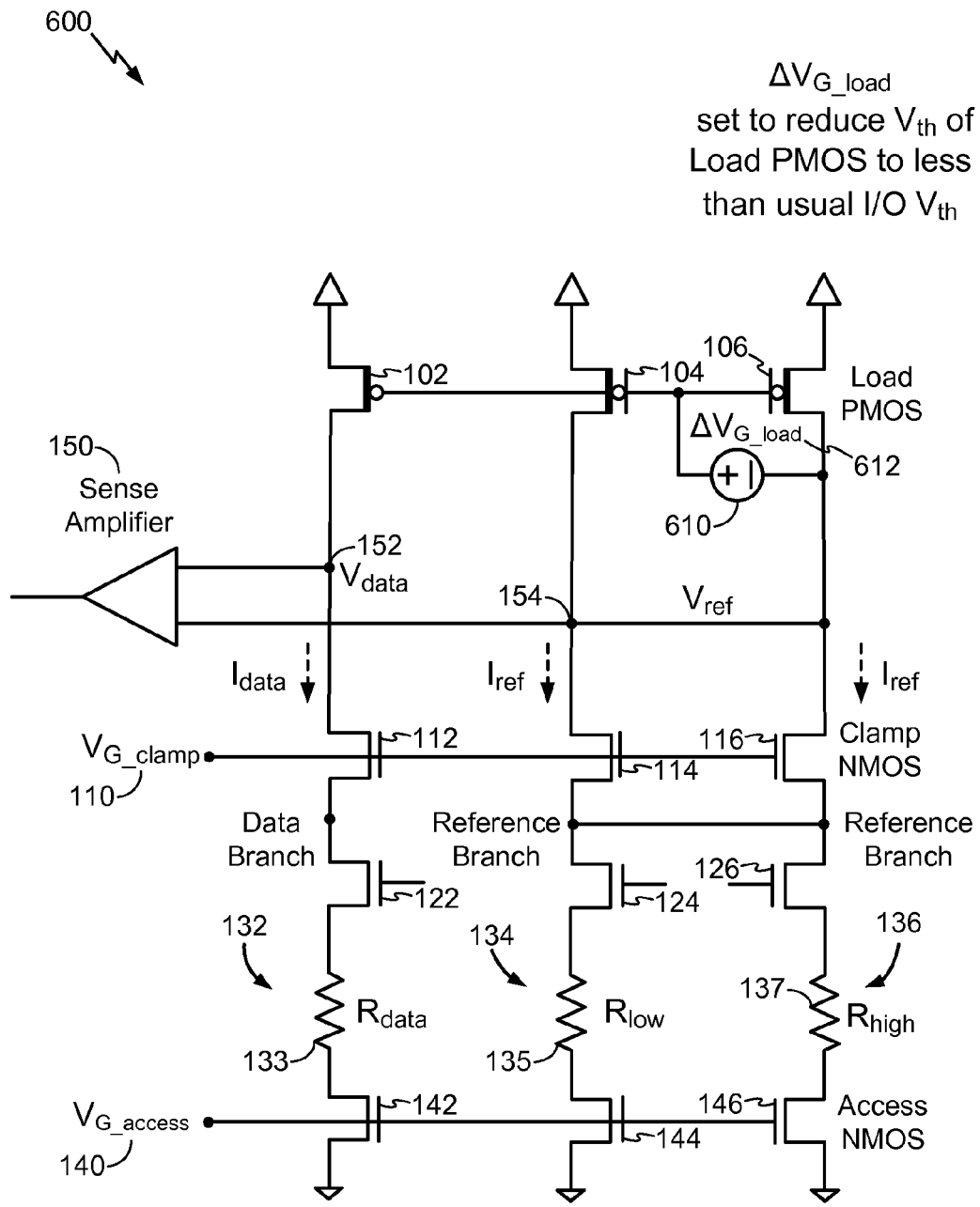
FIG. 6 is a schematic diagram of a sensing circuit that is similar to the sensing circuit of FIG. 1 with the addition of an implantation to reduce the threshold voltage of I/O load PMOS transistors.

According to illustrative embodiments of the present disclosure, the threshold voltage of an I/O transistor may be reduced, even when a reduced supply voltage (e.g., one volt) is applied, by adding an ion implantation step in a fabrication process to adjust the channel characteristics of the I/O transistors 102, 104, 106 of FIG. 1. Changing the concentration of holes in the I/O transistors 102, 104, 106 as a result of the implantation in a die containing the I/O device reduces the threshold voltage of the I/O transistors 102, 104, 106. (The reduction in the threshold voltage as a result of the implantation may be simulated by invoking a voltage source 610 for Spice simulations, as shown in FIG. 6). Alternatively, or in addition, applying a body bias to the I/O device may be used to reduce the threshold voltage.

FIG. 6 is a schematic diagram of a sensing circuit 600 that is similar to the sensing circuit 100 of FIG. 1 with an ion implementation (simulated by the voltage source 610 having a value of $\Delta V_{G\_load}$ 612) to change the threshold voltage of the I/O load PMOS transistors, such as I/O load PMOS transistor 106. The implantation has a similar effect of supplying a voltage $\Delta V_{G\_load}$ 612 that is used to simulate the reduced threshold voltage. The more negative $\Delta V_{G\_load}$ 612 is configured to be by the ion implantation and the simulated voltage source 610 (e.g., the further below 0 volts an output of $\Delta V_{G\_load}$ 612 is), the lower is the threshold voltage of the I/O transistors 102, 104, 106.

Figure 7A:
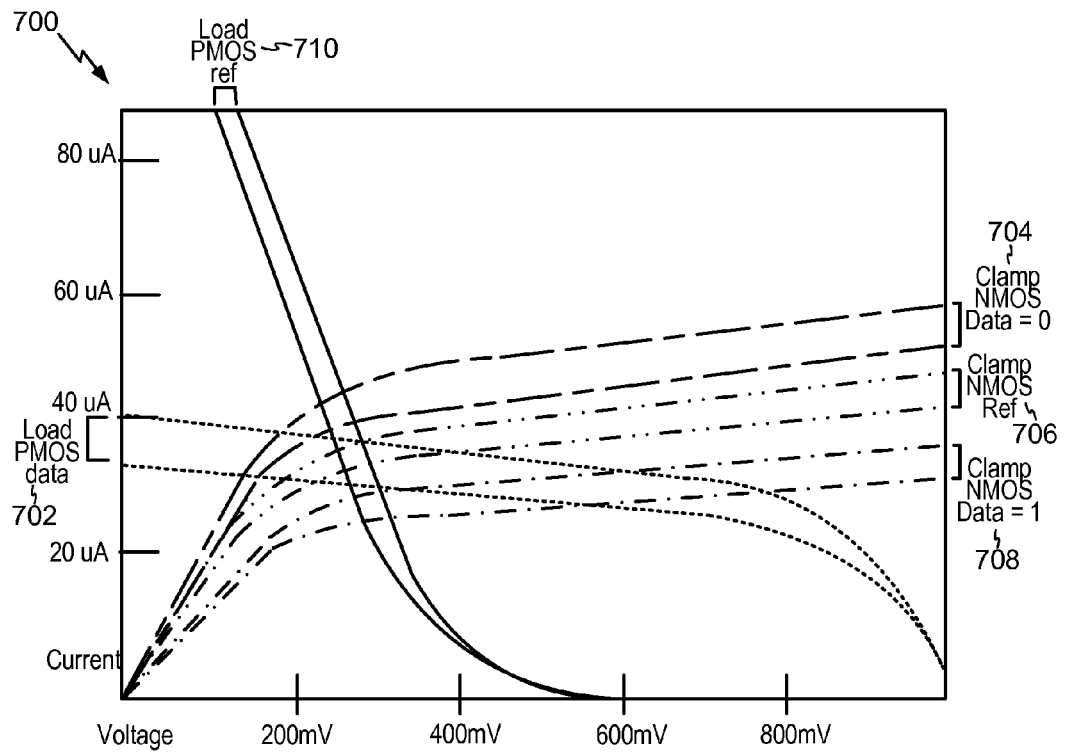
FIG. 7 is a pair of current/voltage graphs (I-V curves) illustrating an effect of an implantation (such as the implantation of FIG. 6), depicting an effect of the implantation on the sensing margin using an I/O transistor.
Figure 7B:
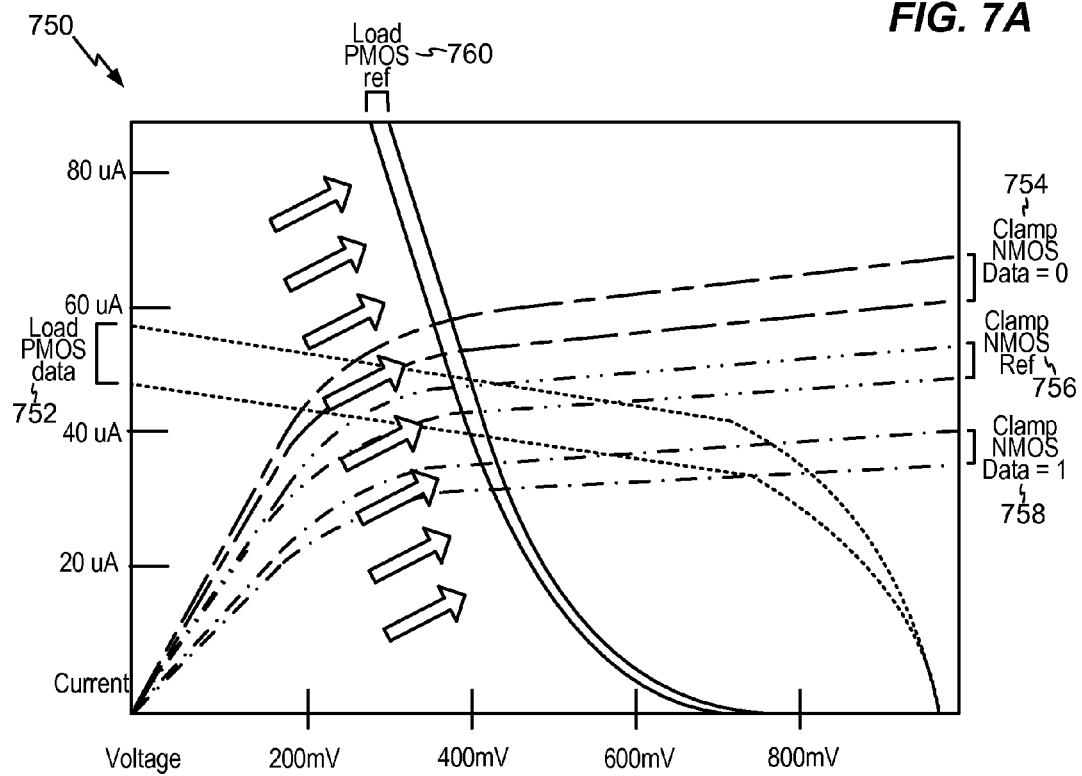

FIG. 7 includes two current/voltage graphs 700 and 750 (I-V curves) illustrating an effect of the ion implantation to depict an effect of the implantation on the sensing margin using an I/O transistor. The graphs 700 and 750 depict the effect of process variations at a supply voltage of 1.0 volts. The graph 700 of depicts the effect of process variations for a sensing circuit using an I/O transistor without an implantation, as shown in FIG. 1. The graph 700 includes a range of current for a data path measured at a load PMOS transistor 702 and a current range for a data path measured at a clamp NMOS transistor with a logical zero data value 704, a current range for a data path measured at a clamp NMOS transistor at a reference data value 706, and a current range for a data path measured at a clamp NMOS transistor with a logical one data value 708. As was depicted in the graph 500 FIG. 5, for example, the process variations that cause the variations in current range 502-508 also result in a range of output voltages of a load PMOS transistor at a reference voltage 710. As described with reference to FIG. 4, the sensing margin for a supply voltage of 1.0 volts 460 is relatively small, derived from a minimum of ΔV0 470 of 0.025 volts and ΔV1 480 of 0.061 volts.

The graph 750 of FIG. 7 depicts the effects of process variations for a sensing circuit using an I/O transistor with an ion implantation to reduce the threshold voltage. The result of the implantation is simulated by a voltage source 610, as shown in FIG. 6, supplying a voltage of −0.2 volts. The graph 750 of FIG. 7 also includes an I-V range for a load PMOS I/O transistor 752. The graph 750 also shows, an I-V range for a clamp NMOS transistor coupled to with a logical zero data value 754 (such as clamp transistor 112 coupled to memory cell 132), an I-V range for a clamp NMOS transistor at a reference data value 756 (such as clamp transistors 114, 116 coupled to reference cells 134, 136), and an I-V range for a clamp NMOS transistor coupled to a memory cell storing a logical one data value 758 (such as clamp transistor 112 coupled to the memory cell 132). The implantation increases minimum and maximum values of each of the current ranges I-V ranges 752-758 as compared with the I-V ranges 702-708, respectively, for a sensing circuit without the implantation 610.

A notable effect of the implantation 610 is the shift of the range of output voltages of a load PMOS transistor at a reference voltage 760. The effect of implantation, as simulated by the voltage source 610, increases ΔV0 to of 0.091 volts and ΔV1 of 0.246 volts, thereby improving the sensing margin significantly as compared to ΔV0 of 0.025 volts and ΔV1 of 0.061 volts without the implantation.

Figure 8:
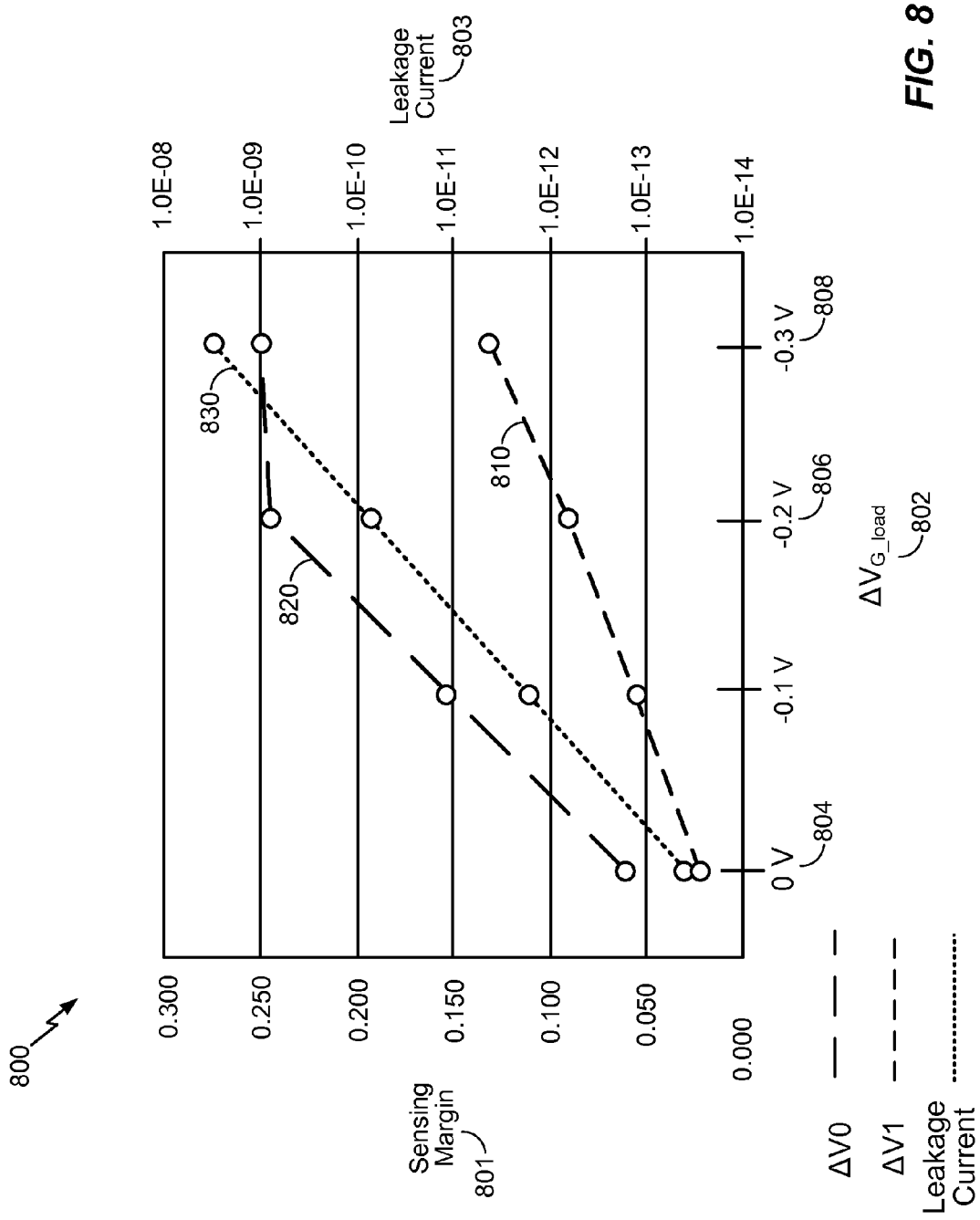
FIG. 8 is a line graph depicting a change in sensing margins and leakage currents in a sensing circuit using an ion implantation that reduces a threshold voltage of an I/O transistor at a range of voltage levels.

FIG. 8 is a line graph 800 depicting a change in sensing margins 801 and leakage currents 803 in a sensing circuit using an implantation that results in $\Delta V_{G\_load}$ 802 decreasing the threshold voltage of the I/O transistors operating at a plurality of supply voltage levels. The graph 800 shows that, between a value $\Delta V_{G\_load}$ 802 of 0 volts 804 and −0.2 volts 806, values of ΔV0 810 and ΔV1 820 continue to increase, thereby increasing the sensing margin. On the other hand, the graph 800 also shows a leakage current 830 that increases steadily with an increase in $\Delta V_{G\_load}$ 802. ΔV0 810 and ΔV1 820 begin to converge between −0.2 volts 806 and −0.3 volts 808, while magnitude of the leakage current 830 continues to increase. While ΔV1 820 and, even more so, ΔV0 810 increase with increasing values of $\Delta V_{G\_load}$ 802, a desirable value of $\Delta V_{G\_load}$ 802 should be selected to balance a desire for an improved sensing margin while maintaining the leakage current level 830 within an acceptable range. Thus, according to a particular illustrative embodiment, an implantation resulting in a value of $\Delta V_{G\_load}$ 802 of −0.2 volts 806 may provide a desired balance between an improved sensing margin and an acceptable leakage current level.

Figure 9:
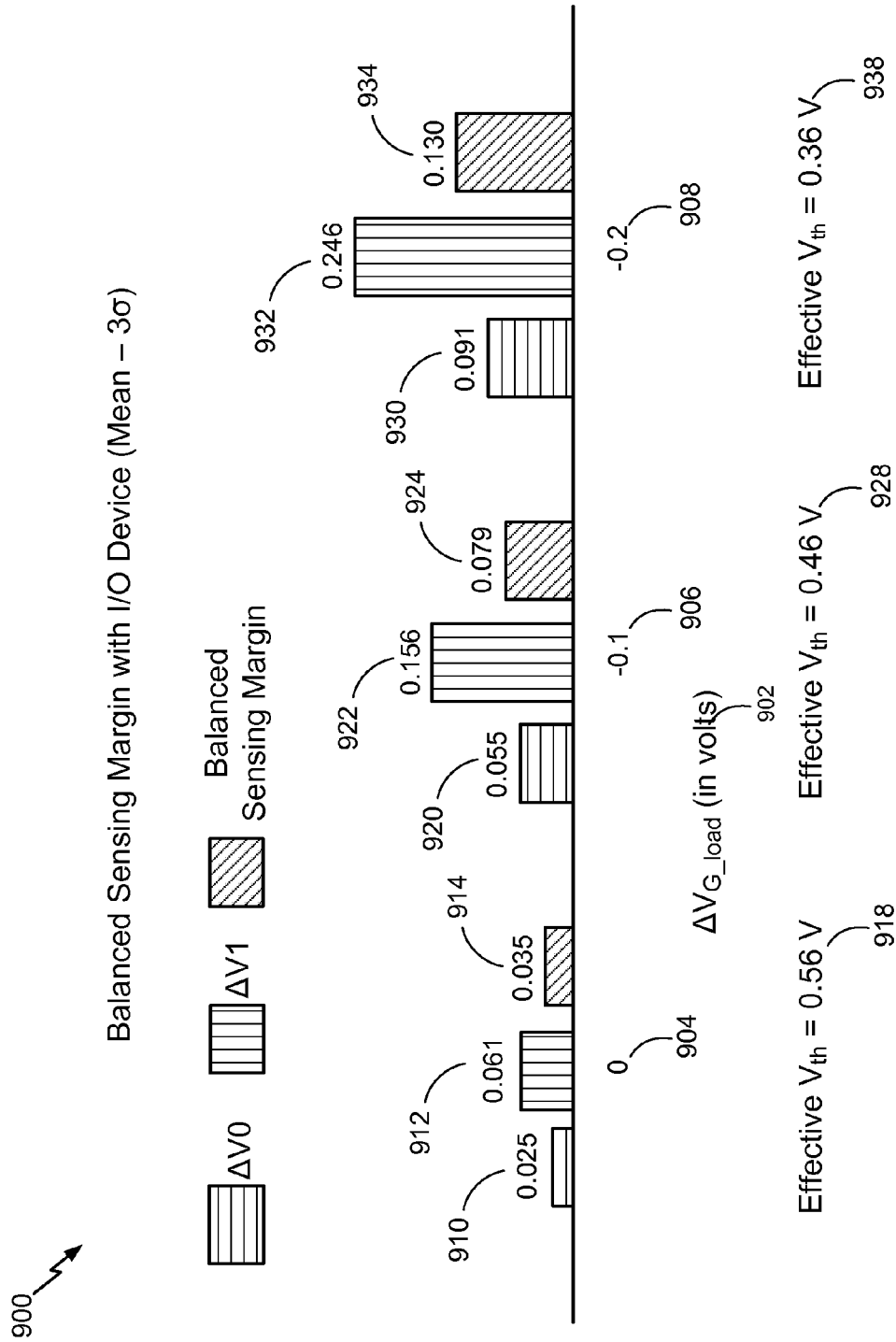
FIG. 9 is a bar graph of the variation in a sensing margin for a logical zero data value, a sensing margin for a logical one data value, and a balanced sensing margin of the sensing circuit of FIG. 6 at different threshold voltage levels resulting from an offset resulting from the implantation in the I/O transistor.

FIG. 9 is a bar graph 900 of a variation in sensing margin for a logical zero voltage, a variation in a sensing margin for a logical one voltage, and a balanced sensing margin of the sensing circuit of FIG. 6 at different output levels of $\Delta V_{G\_load}$ 902 resulting from an ion implantation in fabrication. A balanced sensing margin may be derived by performing a chip-wide optimization, for example, by altering a width of the PMOS I/O transistors 102, 104, 106 (FIGS. 1 and 6). Using a mean minus three sigma (mean−3σ) to determine the balanced sensing margin highlights the individual devices with the poorest sensing margins. Thus, achieving a desirable balanced sensing margin using a mean−3σ methodology ensures a consistent, desirable sensing margin for a given device.

At a $\Delta V_{G\_load}$ value of 0.0 volts 904, ΔV0 has a value of 0.025 volts 910 and a ΔV1 has a value of 0.061 volts 912, resulting in a sensing margin of 0.025 volts. A balanced sensing margin of 0.035 volts 914 can be achieved at $\Delta V_{G\_load}$=0.0 volts. At a $\Delta V_{G\_load}$ of 0.0 volts 904, the threshold voltage is 0.56 volts 918. Increasing the value of $\Delta V_{G\_load}$ to −0.1 volts 906, ΔV0 has a value of 0.055 volts 920 and a ΔV1 has a value of 0.156 volts 922, while a balanced sensing margin of 0.079 volts 924 may be attained. At a $\Delta V_{G\_load}$ of −0.1 volts 906, the threshold voltage is 0.46 volts 928. Increasing the value of $\Delta V_{G\_load}$ to −0.2 volts 908, ΔV0 has a value of 0.091 volts 930 and a ΔV1 has a value of 0.246 volts 932, and a balanced sensing margin of 0.130 volts 934 may be attained. At a $\Delta V_{G\_load}$ of −0.2 volts 908, the threshold voltage is further reduced to 0.36 volts 938. Thus, considering a combination of maximum balanced sensing margin, lowest leakage current, and smallest effective threshold value, an implantation that results in a value of $\Delta V_{G\_load}$ of −0.2 volts 908 may best satisfy design criteria or design constraints.

Figure 10:
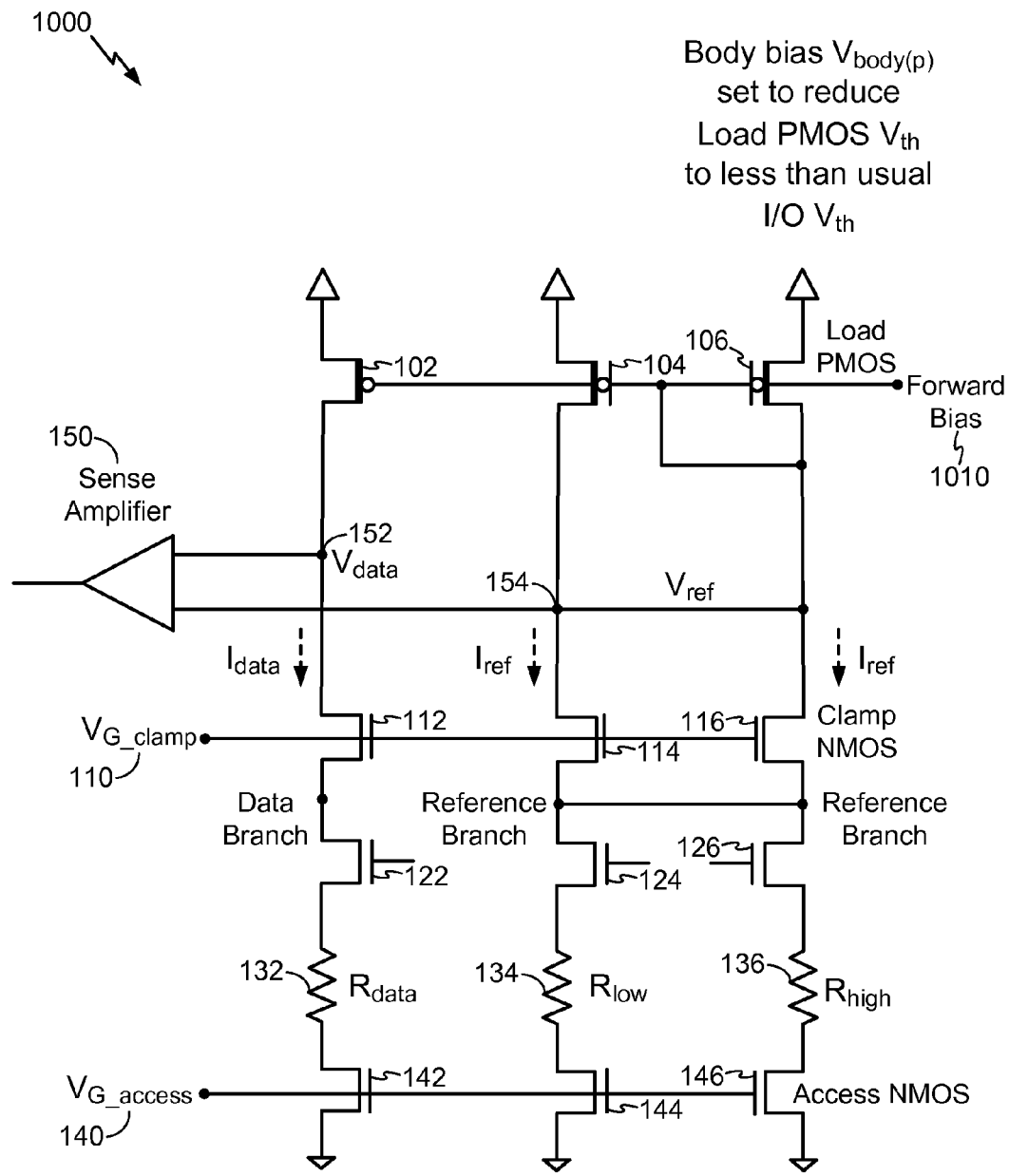
FIG. 10 is a schematic diagram of the sensing circuit of FIG. 1 including a body bias input to alter the threshold voltage of the I/O transistors used in the sensing device.

FIG. 10 is a schematic diagram 1000 of the sensing circuit of FIG. 1 including a body bias input 1010 to alter the threshold voltage of the load I/O transistors 102, 104, 106 used in the sensing device that results in a negative $\Delta V_{G\_load}$ to reduce threshold voltage of the load I/O transistors 102, 104, 106. The sensing circuit 1000 is the same as the sensing circuit 100 of FIG. 1 with the exception of the addition of the body bias input 1010 to the load I/O transistors 102, 104, 106. The body bias input 1010 enables a voltage to be applied to a body of the die including the sensing circuit 1000 which, like $\Delta V_{G\_load}$ resulting from the implantation, reduces the threshold voltage of the load transistors 102, 104, 106.

Figure 11:
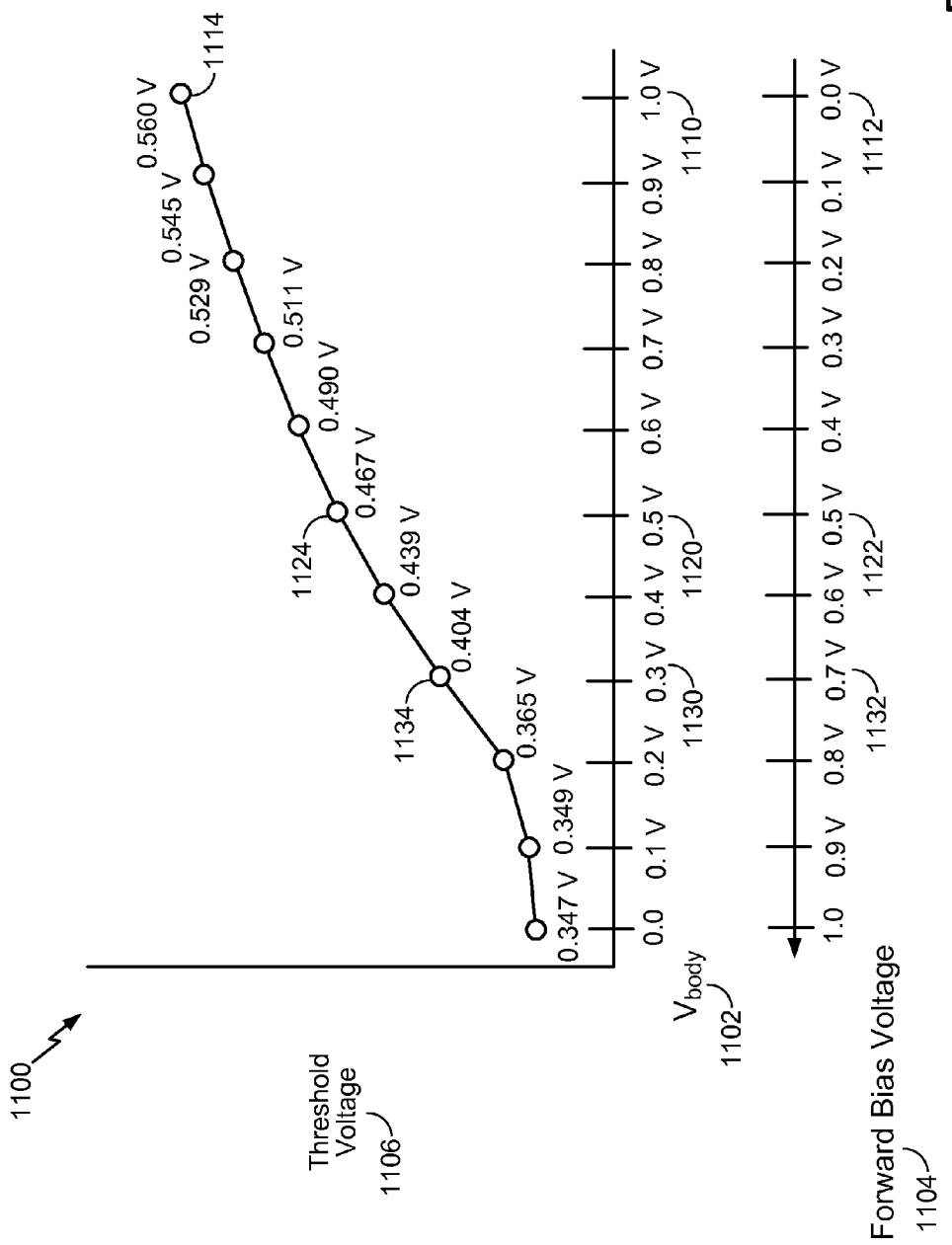
FIG. 11 is a line graph illustrating an effect of varying levels of forward bias voltage on a body voltage level and in reducing a threshold voltage of the I/O transistors used in the sensing circuit of FIG. 10.

FIG. 11 is a line graph 1100 illustrating an effect of varying levels of forward bias voltage 1104 on a body voltage level $V_{body}$ 1102 and in reducing a threshold voltage 1106 of the load I/O transistors 102, 104, 106 used in the sensing circuit 1000 of FIG. 10. At a $V_{body}$ level 1102 of 1.0 volt 1110 with a forward bias voltage of 0 volts 1112, the threshold voltage is 0.560 volts 1114. (The threshold voltage of 0.560 volts 1114 is the same as the threshold voltage of an I/O transistor at a supply voltage of 1.0 volt with an implantation generating a $\Delta V_{G\_load}$ value of 0 volts as described with reference to FIG. 9.) Reducing the $V_{body}$ level to 0.5 volts 1120 by increasing the forward bias voltage level to 0.5 volts 1122 reduces the threshold voltage to 0.467 volts 1124. Similarly, reducing the $V_{body}$ level to 0.3 volts 1130 by increasing the forward bias voltage level to 0.7 volts 1132 reduces the threshold voltage to 0.404 volts 1134.

Figure 12:
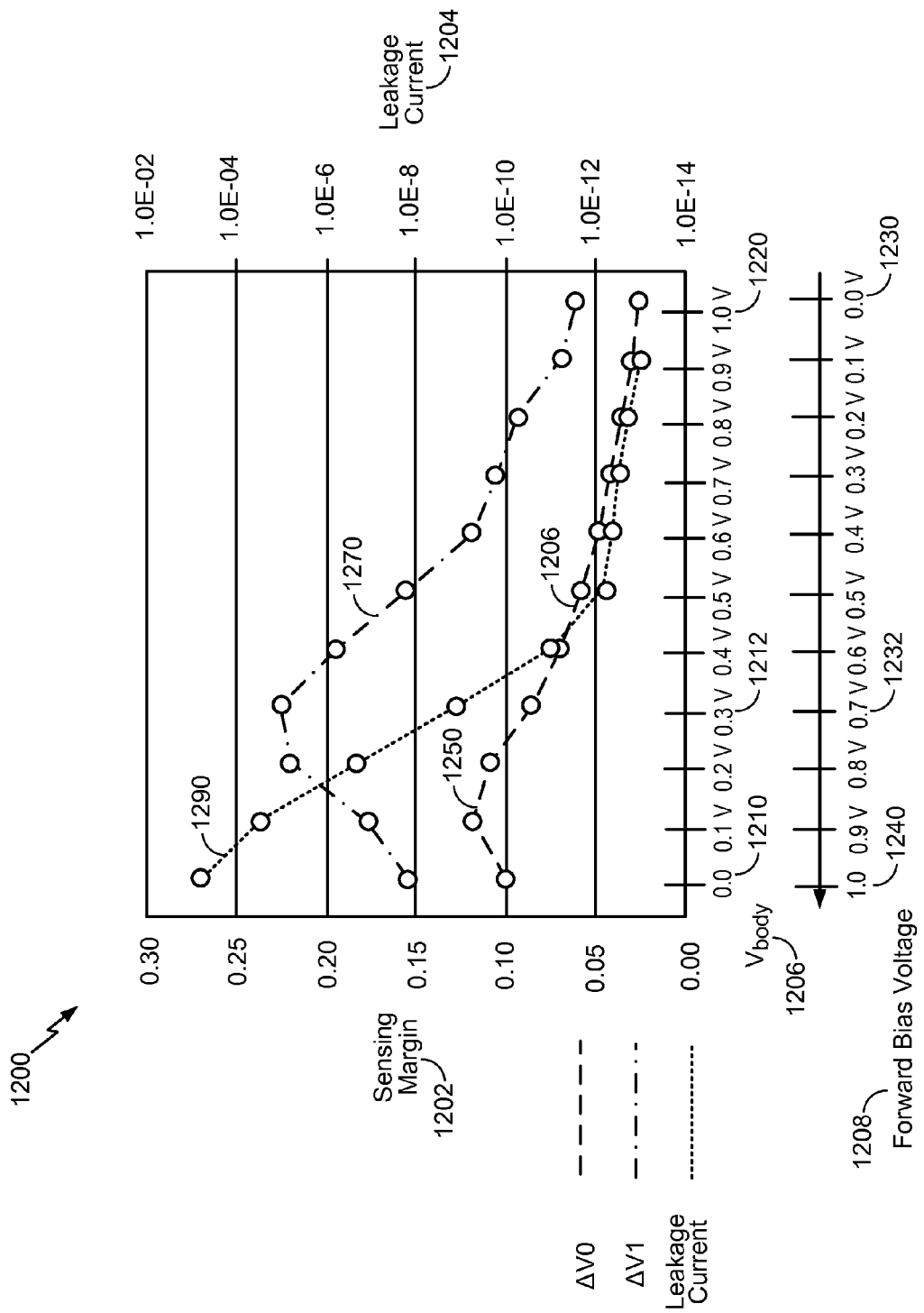
FIG. 12 is a line graph depicting changes in sensing margin and leakage current in a sensing circuit in response to a body voltage being adjusted by an applied forward bias voltage.

FIG. 12 is a line graph 1200 depicting changes in sensing margin 1202 and leakage current 1204 in a sensing circuit in response to a body voltage 1206 being adjusted by an applied forward bias voltage 1208. The graph 1200 shows that, between a forward bias voltage 1208 of 0 volts 1230 and 1.0 volt 1240 and a commensurate decreasing body voltage $V_{body}$ 1206 of 1.0 volt 1220 and 0 volts 1210, values of ΔV0 1250 and ΔV1 1270 diverge until the forward bias voltage 1208 reaches 0.7 volts 1232 (and $V_{body}$ 1206 reaches 0.3 volts 1212), where the values of ΔV0 1250 and ΔV1 1270 begin to converge. A leakage current 1290 continues to increase with increasing forward bias voltage 1208. Thus, although the sensing margin 1202 may be increased by continuing to increase the forward bias voltage 1208, the sensing margin 1202 selected should be balanced against an acceptable leakage current level 1204. Thus, for example, if a highest acceptable leakage current level 1204 is in the range of 1.0E-10, a forward bias voltage 1208 of 0.2 volts or 0.3 volts may be selected to improve the sensing margin without resulting in an unacceptably high leakage current 1290.

Figure 13:
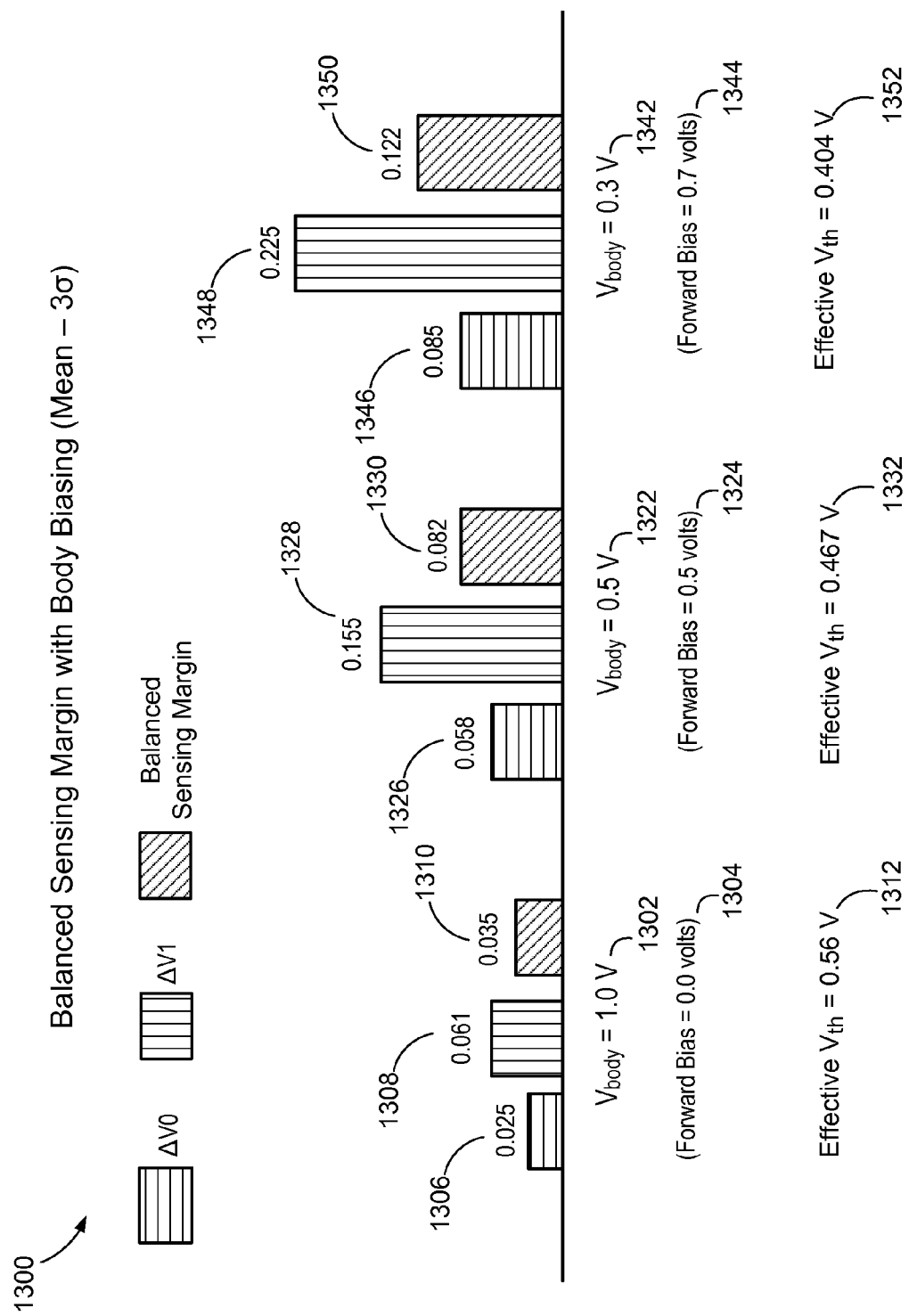
FIG. 13 is a representative bar graph of the variation in logical zero voltage, variation in logical one voltage, and the balanced sensing margin resulting in the sensing circuit of FIG. 10 from using a zero bias voltage and various nonzero bias voltages.

FIG. 13 is a bar graph of the variation in ΔV0, ΔV1, and balanced sensing margin as a result of a forward bias voltage reducing a body voltage $V_{body}$ in the sensing circuit of FIG. 10. At a $V_{body}$ level bias voltage of 1.0 volt 1302 resulting from a forward bias voltage of 0.0 volts 1304, ΔV0 has a value of 0.025 volts 1306, ΔV1 has a value of 0.061 volts 1308, and a balanced sensing margin of 0.035 volts 1310 may be attained. At the forward bias voltage of 0.0 volts 1304, the threshold voltage is 0.56 volts 1312. At a $V_{body}$ level of 0.5 volts 1322 resulting from a forward bias voltage of 0.5 volts 1324 ΔV0 has a value of 0.058 volts 1326 and ΔV1 has a value of 0.155 volts 1328, and a balanced sensing margin 1330 of 0.082 volts may be attained. At the forward bias voltage of 0.5 volts 1324, the threshold voltage is 0.467 volts 1332. Increasing the forward bias voltage to 0.7 volts 1344 reduced the $V_{body}$ level to 0.3 volts 1342, resulting in ΔV0 having a value of 0.085 volts 1346 and ΔV1 having a value of 0.225 volts 1348, and a balanced sensing margin of 0.122 volts 1350 may be attained. At the forward bias value of 0.7 volts 1344, the threshold voltage is further reduced to 0.404 volts. Thus, considering a combination of maximum balanced sensing margin, lowest leakage current (FIG. 12), and smallest effective threshold value, a forward bias voltage of 0.7 volts 1344 may be determined to best satisfy design criteria or design constraints.

Figure 14:
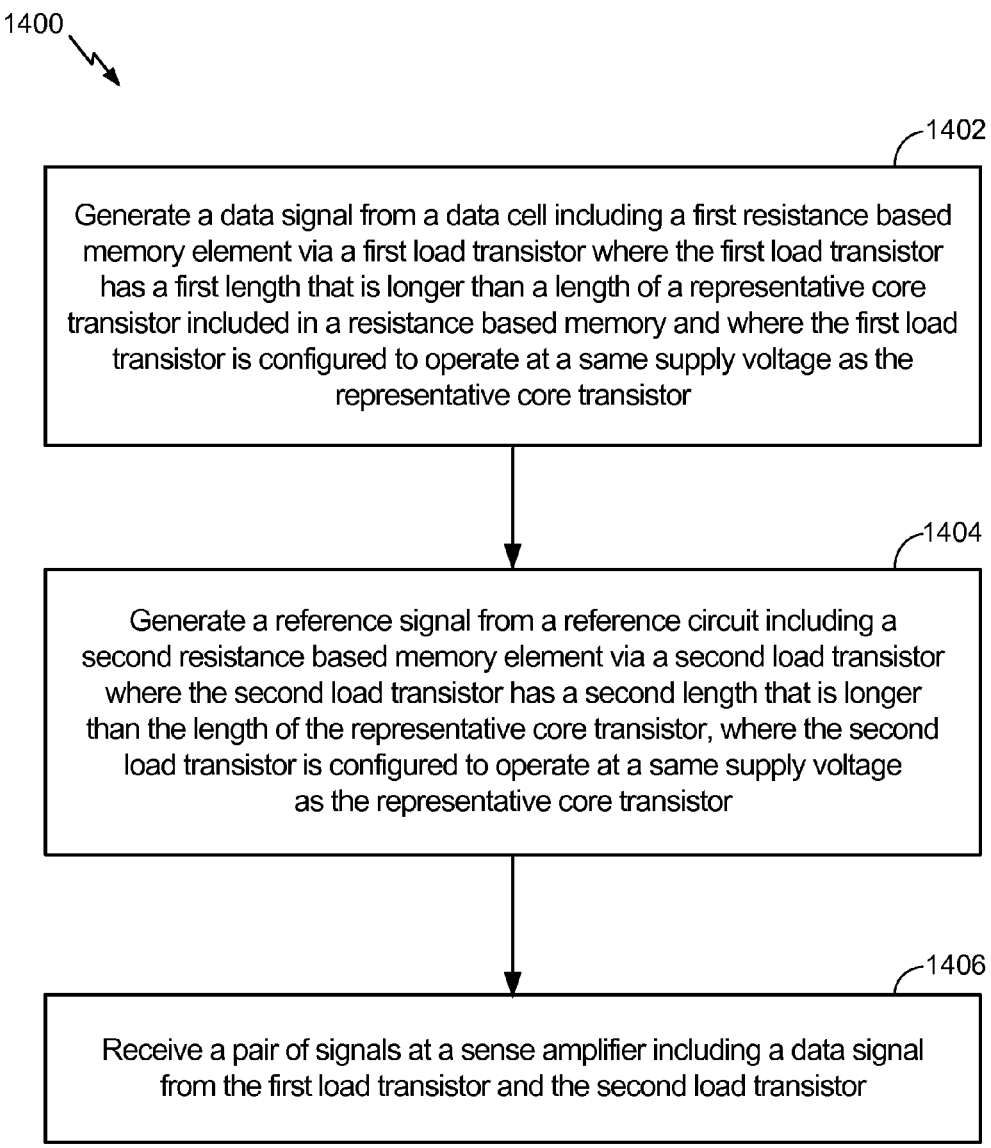
FIG. 14 is a flow diagram of a particular illustrative method of generating data and reference signals using I/O transistors adapted to operate at a same supply voltage as a representative core transistor.

FIG. 14 is a flow diagram 1400 of a particular illustrative method of generating data and reference signals using I/O transistors adapted to operate at a same supply voltage as a representative core transistor. A data signal from a data cell including a first resistance based memory element via a first load transistor is generated, at 1402. The first load transistor has a first length that is longer than a length of a representative core transistor included in a resistance based memory. The first load transistor is configured to operate at a same supply voltage as the representative core transistor. A reference signal is generated from a reference circuit including a second resistance based memory element via a second load transistor, at 1404. The second load transistor has a second length that is longer than the length of the representative core transistor. The second load transistor is configured to operate at a same supply voltage as the representative core transistor. The threshold voltage of the first load transistor and the second load transistor is adjusted to be less than a threshold voltage of the representative core transistor. A pair of signals is received at a sense amplifier including a data signal from the first load transistor and the second load transistor, at 1406. The data value represented by the pair of data signals is sensed with an improved sensing margin, as described with respect to FIGS. 1-14.

Figure 15:
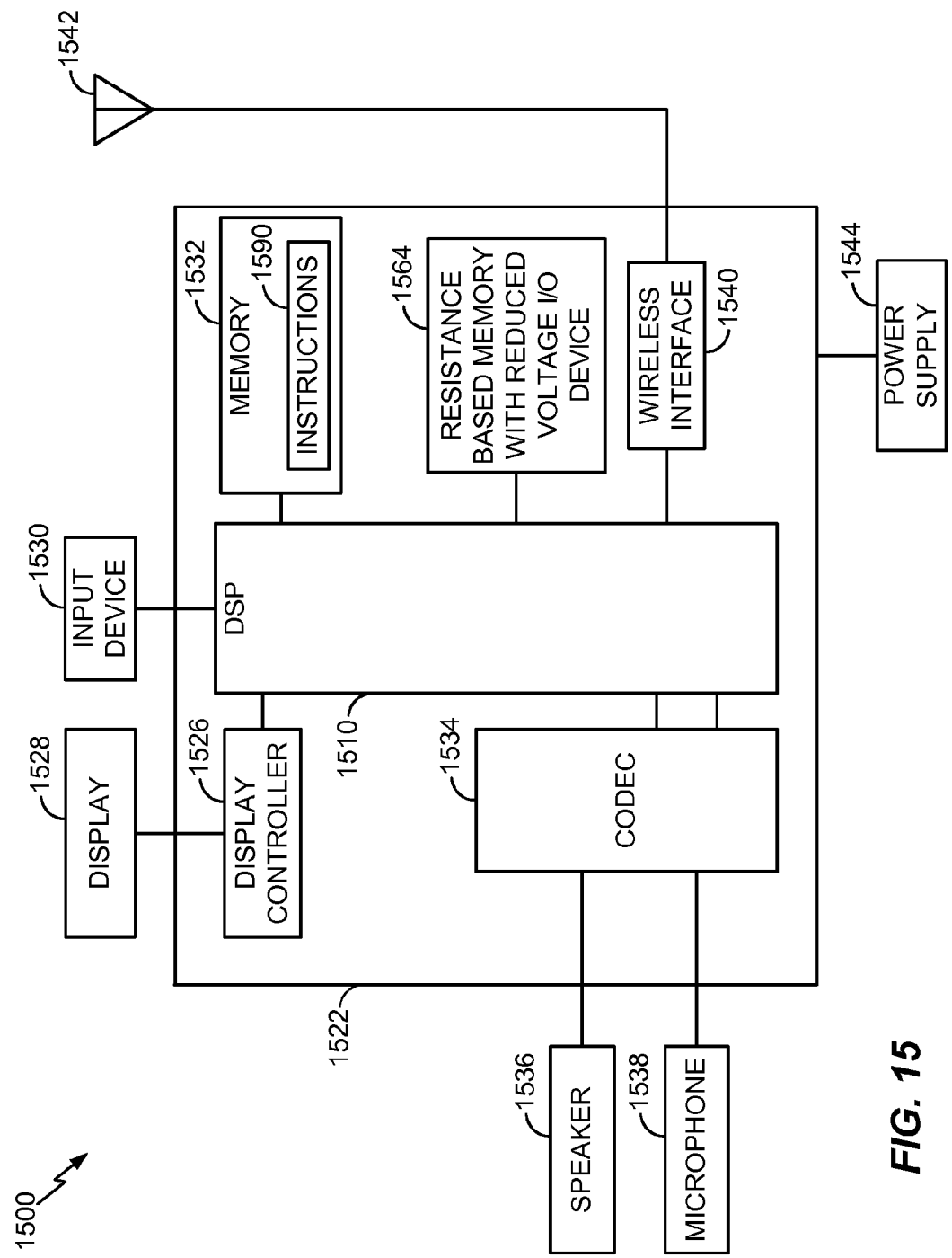
FIG. 15 is a block diagram of a particular illustrative embodiment of a communications device that includes a resistance based memory that includes a reduced voltage I/O device as described with reference to FIGS. 1-14.

FIG. 15 is a block diagram of a particular illustrative embodiment of a communications device 1500 that includes a resistance based memory that includes a reduced voltage I/O device as described with reference to FIGS. 1-14. The communications device 1500 includes an on-chip device 1522 that implements a plurality of functions for the communications device 1500. The on-chip device 1522 includes a digital signal processor (DSP) 1510 that performs processing functions for the on-chip device 1522. The digital signal processor 1510 is coupled to one or more memory devices, such as memory 1532 and 1564. The memory device 1532 may be a read only memory that stores instructions 1590 that control operation of functions performed by the digital signal processor 1510. The memory device 1564 may be a random access memory unit that includes a resistance based memory with a reduced voltage I/O device as described with reference to FIGS. 1-14.

FIG. 15 also shows a display controller 1526 that is coupled to the digital signal processor 1510 and to a display 1528. An input device 1530 is coupled to the digital signal processor 1510. A coder/decoder (CODEC) 1534 can also be coupled to the digital signal processor 1510. A speaker 1536 and a microphone 1538 may be coupled to the CODEC 1534.

FIG. 15 also indicates that a wireless interface 1540 that may be coupled to the digital signal processor 1510 and to a wireless antenna 1542. In a particular embodiment, a power supply 1544 is coupled to the on-chip system 1522. Moreover, in a particular embodiment, as illustrated in FIG. 15, the display 1528, the input device 1530, the speaker 1536, the microphone 1538, the wireless antenna 1542, the power supply 1544, and a video camera 1570 are external to the on-chip system 1522. However, each is coupled to a component of the on-chip system 1522.

Figure 16:
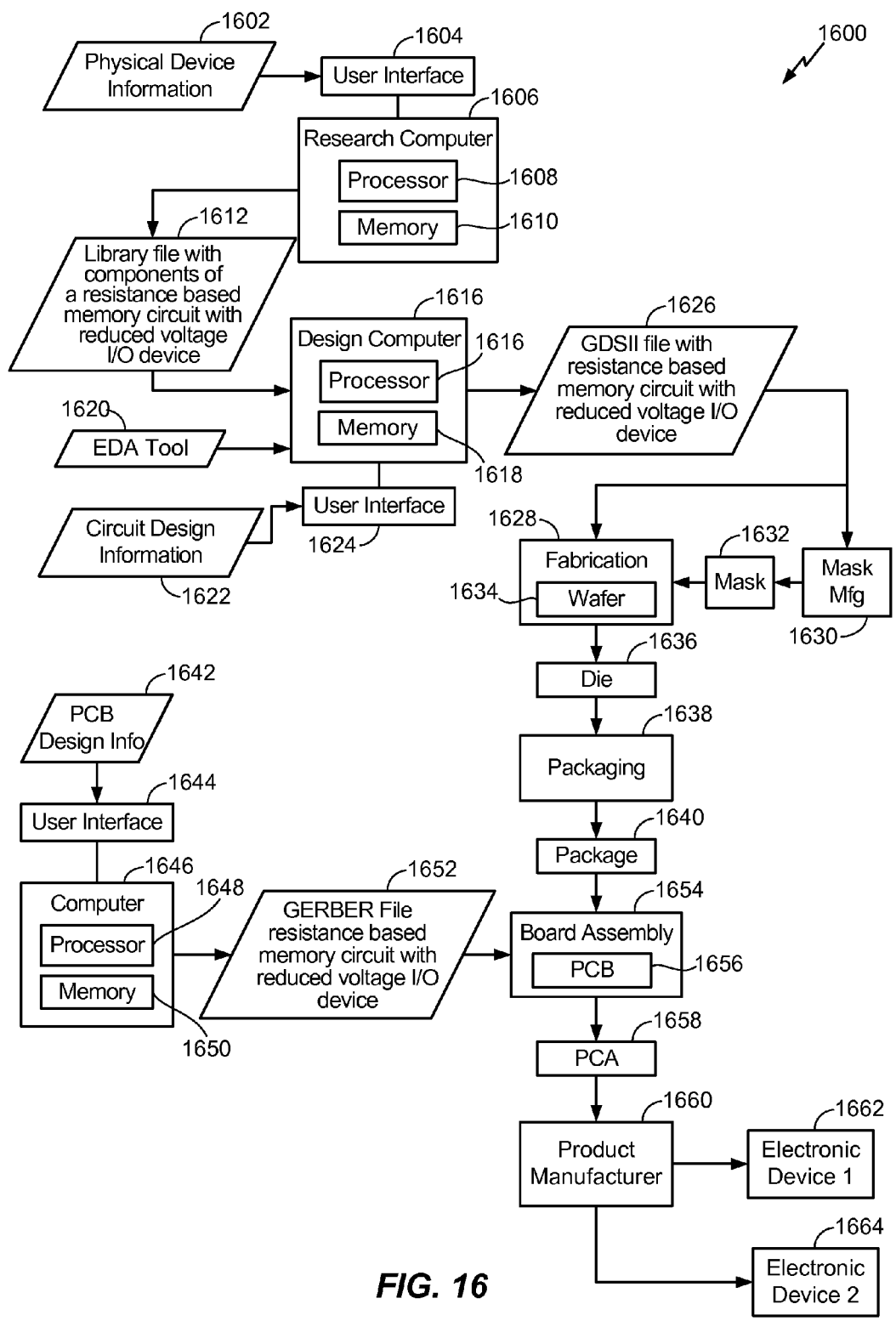
FIG. 16 depicts a particular illustrative embodiment of an electronic device manufacturing process 1600 for manufacturing a resistance based memory that includes a reduced voltage I/O device as described with reference to FIGS. 1-14.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices such as the communications device described above with reference to FIG. 15 or in other devices. FIG. 16 depicts a particular illustrative embodiment of an electronic device manufacturing process 1600.

Physical device information 1602 is received in the manufacturing process 1600, such as at a research computer 1606. The physical device information 1602 may include design information representing at least one physical property of a semiconductor device, such as a processor or other semiconductor device including a resistance based memory with a reduced voltage I/O device as described with reference to FIGS. 1-14. For example the physical device information 1602 may include physical parameters, material characteristics, and structure information that is entered via a user interface 1604 coupled to the research computer 1606. The research computer 1606 includes a processor 1608, such as one or more processing cores, coupled to a computer readable medium such as a memory 1610. The memory 1610 may store computer readable instructions that are executable to cause the processor 1608 to transform the physical device information 1602 to comply with a file format and to generate a library file 1612.

In a particular embodiment, the library file 1612 includes at least one data file including the transformed design information. For example, the library file 1612 may include a library of semiconductor devices including the resistance based memory with a reduced voltage I/O device of FIGS. 1-14 that is provided for use with an electronic design automation (EDA) tool 1620.

The library file 1612 may be used in conjunction with the EDA tool 1620 at a design computer 1614 including a processor 1616, such as one or more processing cores, coupled to a memory 1618. The EDA tool 1620 may be stored as processor executable instructions at the memory 1618 to enable a user of the design computer 1614 to design a circuit using a resistance based memory with a reduced voltage I/O device as described with reference to FIGS. 1-14. For example, a user of the design computer 1614 may enter circuit design information 1622 via a user interface 1624 coupled to the design computer 1614. The circuit design information 1622 may include design information representing at least one physical property of a semiconductor device, such as a processor or other semiconductor device using a resistance based memory with a reduced voltage I/O device as described with reference to FIGS. 1-14. To illustrate, the circuit design property may include identification of particular circuits and relationships to other elements in a circuit design, positioning information, feature size information, interconnection information, or other information representing a physical property of a semiconductor device.

The design computer 1614 may be configured to transform the design information, including the circuit design information 1622 to comply with a file format. To illustrate, the file formation may include a database binary file format representing planar geometric shapes, text labels, and other information about a circuit layout in a hierarchical format, such as a Graphic Data System (GDSII) file format. The design computer 1614 may be configured to generate a data file including the transformed design information, such as a GDSII file 1626 that includes information describing the resistance based memory with a reduced voltage I/O device as described with reference to FIGS. 1-14, in addition to other circuits or information. To illustrate, the data file may include information corresponding to a system-on-chip (SOC) using a resistance based memory with a reduced voltage I/O device as described with reference to FIGS. 1-14 and that also includes additional electronic circuits and components within the SOC.

The GDSII file 1626 may be received at a fabrication process 1628 to manufacture a device using resistance based memory with a reduced voltage I/O device as described with reference to FIGS. 1-14 according to transformed information in the GDSII file 1626. For example, a device manufacture process may include providing the GDSII file 1626 to a mask manufacturer 1630 to create one or more masks, such as masks to be used for photolithography processing, illustrated as a representative mask 1632. The mask 1632 may be used during the fabrication process to generate one or more wafers 1634, which may be tested and separated into dies, such as a representative die 1636. The die 1636 includes a circuit including such as using a resistance based memory with a reduced voltage I/O device as described with reference to FIGS. 1-14.

The die 1636 may be provided to a packaging process 1638 where the die 1636 is incorporated into a representative package 1640. For example, the package 1640 may include the single die 1636 or multiple dies, such as a system-in-package (SiP) arrangement. The package 1640 may be configured to conform to one or more standards or specifications, such as Joint Electron Device Engineering Council (JEDEC) standards.

Information regarding the package 1640 may be distributed to various product designers, such as via a component library stored at a computer 1646. The computer 1646 may include a processor 1648, such as one or more processing cores, coupled to a memory 1610. A printed circuit board (PCB) tool may be stored as processor executable instructions at the memory 1610 to process PCB design information 1642 received from a user of the computer 1646 via a user interface 1644. The PCB design information 1642 may include physical positioning information of a packaged semiconductor device on a circuit board, the packaged semiconductor device corresponding to the package 1640 including a processor or other semiconductor device using a resistance based memory with a reduced voltage I/O device as described with reference to FIGS. 1-14.

The computer 1646 may be configured to transform the PCB design information 1642 to generate a data file, such as a GERBER file 1652. The GERBER file 1652 or other data file may include data that includes physical positioning information of a packaged semiconductor device on a circuit board. The GERBER file 1652 or other data file may also include information describing layout of electrical connections such as traces and vias, where the packaged semiconductor device includes a processor or other semiconductor device using a resistance based memory with a reduced voltage I/O device as described with reference to FIGS. 1-14. In other embodiments, the data file generated by the transformed PCB design information may have a format other than a GERBER format.

The GERBER file 1652 may be received at a board assembly process 1654 and used to create PCBs, such as a representative PCB 1656, manufactured in accordance with the design information stored within the GERBER file 1652. For example, the GERBER file 1652 may be uploaded to one or more machines for performing various steps of a PCB production process. The PCB 1656 may be populated with electronic components including the package 1640 to form a represented printed circuit assembly (PCA) 1658.

The PCA 1658 may be received at a product manufacture process 1660 and integrated into one or more electronic devices, such as a first representative electronic device 1662 and a second representative electronic device 1664. As an illustrative, non-limiting example, the first representative electronic device 1662, the second representative electronic device 1664, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1662 and 1664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Notwithstanding, the disclosure is not limited to these exemplary illustrated units.

Thus, a processor or other semiconductor device using a resistance based memory with a reduced voltage I/O device as described with reference to FIGS. 1-14 may be fabricated, processed, and incorporated into an electronic device, as described in the illustrative process 1600. One or more aspects of the embodiments disclosed with respect to FIGS. 1-14 may be included at various processing stages, such as within the library file 1612, the GDSII file 1626, and the GERBER file 16102, as well as stored at the memory 1610 of the research computer 1606, the memory 1618 of the design computer 1614, the memory 1650 of the computer 1646, the memory of one or more other computers or processors (not shown) used at the various stages, such as at the board assembly process 1654, and also incorporated into one or more other physical embodiments such as the mask 1632, the die 1636, the package 1640, the PCA 1658, other products such as prototype circuits or devices (not shown), or any combination thereof. Although various representative stages of production from a physical device design to a final product are depicted, in other embodiments fewer stages may be used or additional stages may be included. Similarly, the process 1600 may be performed by a single entity, or by one or more entities performing various stages of the process 1600.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
    a data path comprising a first resistive memory cell and a first load transistor; and
    a reference path comprising a second resistive memory cell and a second load transistor,
    wherein the first load transistor and the second load transistor are input and output (I/O) transistors adapted to operate at a load supply voltage similar to a core supply voltage of a core transistor within the circuit, and
    wherein the first load transistor and the second load transistor have a load supply voltage of less than 1.8 volts.

2. The circuit of claim 1, wherein the core transistor is one of a clamping transistor and an access transistor in the data path.

3. The circuit of claim 1, wherein the load supply voltage is about 1 volt.

4. The circuit of claim 1, further comprising implantations in the first load transistor and the second load transistor to reduce a threshold voltage of the first load transistor and the second load transistor.

5. The circuit of claim 1, further comprising a plurality of body bias inputs configured to receive a forward body bias to reduce a threshold voltage of the first load transistor and the second load transistor.

6. The circuit of claim 1, wherein the first resistive memory cell and the second resistive memory cell each comprise a cell of a magnetoresistive random access memory (MRAM) device.

7. The circuit of claim 1, further comprising a sense amplifier circuit, wherein the sense amplifier circuit comprises a first input to receive a data voltage from the data path and a second input to receive a reference voltage from the reference path.

8. The circuit of claim 7, wherein parameters of the I/O transistors are adjusted to improve a sensing margin of the sense amplifier circuit.

9. The circuit of claim 8, wherein a variation in a logic zero voltage and a variation in a logic one voltage relative to an average variation in reference voltage are adjusted to improve the sensing margin of the sense amplifier circuit.

10. The circuit of claim 1 integrated in at least one semiconductor die.

11. The circuit of claim 1, further comprising a device selected from. the group consisting of a set top box, a music player, a video player, an entertainment unit, a navigation device, a communications device, a personal digital assistant (PDA), a fixed location data unit, and a computer, into which the circuit is integrated.

12. A memory device comprising:
 a circuit, comprising:
  a data path comprising a first resistive memory cell accessed by one or more of a plurality of core transistors and generating a data signal via, a first load transistor;
  a reference data path comprising a second resistive memory cell accessed by one or more of the plurality of core transistors and generating a reference signal via a second load transistor,
  wherein the first load transistor and the second load transistor each have a first length that is longer than a length of a representative core transistor of the plurality of core transistors, and wherein the circuit is configured to adapt the first load transistor and the second load transistor to operate at a supply voltage of the plurality of core transistors and to operate at a reduced threshold voltage; and
  a sense amplifier circuit, wherein the sense amplifier circuit comprises a first input to receive the data signal from the data path and a second input to receive the reference signal from the reference path.

13. The memory device of claim 12, wherein the first length of the first load transistor and the second load transistor is at least twice as long as the length of the representative core transistor.

14. The memory device of claim 12, wherein the first length of the first load transistor and the second load transistor is at least three times as long as the length of the representative core transistor.

15. The memory device of claim 12, wherein the first length of the first load transistor and the second load transistor is about 400 nanometers and the length of the representative core transistor is about 145 nanometers.

16. The memory device of claim 12, wherein the first load transistor and the second load transistor each have a first width that is wider than a width of the representative core transistor.

17. The memory device of claim 12, wherein the first load transistor and the second load transistor are metal oxide semiconductor field effect transistors (MOSFETs).

18. The memory device of claim 12, wherein the supply voltage is about 1 volt.

19. The memory device of claim 12, further comprising an implantation in the first load transistor and the second load transistor to reduce the threshold voltage of the first load transistor and the second load transistor.

20. The memory device of claim 12, further comprising one or more body bias inputs configured to receive a forward body bias to reduce the threshold voltage of the first load transistor and the second load transistor.

21. The memory device of claim 12, wherein the first resistive memory cell and the second resistive memory cell each comprise a magnetoresistive random access memory (MRAM) cell.

22. The memory device of claim 12, wherein parameters of the first and second load transistors are adjusted to improve a sensing margin of the sense amplifier circuit.

23. The memory device of claim 22, wherein a variation in a logic zero voltage and a variation in a logic one voltage relative to an average variation in reference voltage are adjusted to improve the sensing margin of the sense amplifier circuit.

24. The memory device of claim 12 integrated in at least one semiconductor die.

25. The memory device of claim 12, further comprising a device selected from the group consisting of a set top box, a music player, a video player, an entertainment unit, a navigation device, a communications device, a personal digital assistant (PDA), a fixed location data unit, and a computer, into which the memory device is integrated.

26. An apparatus comprising:
 a memory device comprising:
  means for providing a data voltage from a first resistive memory cell via a first load transistor; and
  means for providing a reference voltage from a second resistive memory cell via a second load transistor,
  wherein the first load transistor and the second load transistor are larger than a core transistor within the memory device and are operated at a load supply voltage similar to a core supply voltage.

27. The apparatus of claim 26, wherein the load supply voltage is less than 1.8 volts.

28. The apparatus of claim 27, wherein the load supply voltage is about 1 volt.

29. The apparatus of claim 26, further comprising means for reducing a threshold voltage of the first load transistor and the second load transistor.

30. The apparatus of claim 29, wherein the means for reducing the threshold voltage of the first load transistor and the second load transistor comprises an implantation in the first load transistor and the second load transistor to reduce the threshold voltage of the first load transistor and the second load transistor.

31. The apparatus of claim 29, wherein the means for reducing the threshold voltage of the first load transistor and the second load transistor comprises body bias inputs configured to receive a forward body bias to reduce the threshold voltage of the first load transistor and the second load transistor.

32. The apparatus of claim 26, further comprising a sense amplifier means, wherein the sense amplifier means comprises a first input to receive the data voltage and a second input to receive the reference voltage.

33. The apparatus of claim 32, wherein parameters of the first load transistor and the second load transistor are adjusted to improve a sensing margin of the sense amplifier means.

34. A method of sensing a data value stored at a resistance based memory, the method comprising:

generating a data signal from a data cell comprises a first resistance based memory element via a first load transistor, wherein the first load transistor has a first length that is longer than a length of a representative core transistor included in a resistance based memory and wherein the first load transistor is configured to operate at a same supply voltage as the representative core transistor;

generating a reference signal from a reference circuit comprises a second resistance based memory element via a second load transistor, wherein the second load transistor has a second length that is longer than the length of the representative core transistor and wherein the second load transistor is configured to operate at the same supply voltage as the representative core transistor; and receiving a pair of signals at a sense amplifier, wherein the pair of signals comprises the data signal and the reference signal.

35. The method of claim 34, wherein a threshold voltage of the first load transistor or the second load transistor is lower than a threshold voltage of the representative core transistor.

36. The method of claim 34, wherein the first length of the first load transistor and the second length of the second load transistor are at least twice as long as the length of the representative core transistor.

37. The method of claim 34, wherein the first load transistor and the second load transistor each have a width that is wider than a width of the representative core transistor.

38. The method of claim 34, further comprising providing a supply voltage of about one volt to a supply voltage input.

39. The method of claim 34, wherein the generating the data signal, the generating the reference signal, and the receiving the pair of signals are performed by a processor integrated into an electronic device.

40. A method of sensing a data value stored at a resistance based memory, the method comprising:

a first step for generating a data signal from a data cell comprising a first resistance based memory element via a first load transistor included in a sense amplifier, wherein the first load transistor has a first length that is longer than a length of a representative core transistor included in a resistance based memory and wherein the first load transistor is configured to operate at a same supply voltage as the representative core transistor for improving a sensing margin of the sense amplifier and is configured to operate at a reduced threshold voltage;

a second step for generating a reference signal from a reference circuit comprising a second resistance based memory element via a second load transistor included in the sense amplifier, wherein the second load transistor has a second length that is longer than the length of the representative core transistor and wherein the second load transistor is configured to operate at the same supply voltage as the representative core transistor for improving the sensing margin of the sense amplifier and is configured to operate at the reduced threshold voltage; and a third step for receiving a pair of signals at a sense amplifier, wherein the pair of signals comprises a data signal from the first load transistor and a reference signal from the second load transistor for determining a data value represented by the data signal.

41. The method of claim 40, further comprising a step for determining an implantation in the first load transistor and the second load transistor for adapting the first load transistor and the second load transistor to operate at the reduced threshold voltage.

42. The method of claim 40, further comprising a step for determining a forward body bias voltage for adapting the first load transistor and the second load transistor to operate at the reduced threshold voltage.

43. The method of claim 40, wherein the first step, the second step, and the third step are performed by a processor integrated into an electronic device.

44. A computer-readable tangible medium storing instructions executable by a computer, the instructions comprising:

instructions that are executable by the computer to receive design information representing one or more physical properties of a semiconductor device, the semiconductor device comprising:

a data path comprising a first resistive memory cell coupled to one or more of a plurality of core transistors to generate a data signal via a first load transistor;

a reference data path comprising a second resistive memory cell coupled to one or more of the plurality of core transistors to generate a reference signal via a second load transistor, wherein the first load transistor and the second load transistor each have a first length that is longer than a second length of a representative core transistor of the plurality of core transistors, and wherein the first load transistor and the second load transistor are adapted to operate at a supply voltage of the plurality of core transistors and to operate at a load threshold voltage lower than a core threshold voltage of the representative core transistor; and a sense amplifier circuit, wherein the sense amplifier circuit comprises a first input to receive the data signal from the data path and a second input to receive the reference signal from the reference path; and instructions that are executable by the computer to manufacture the semiconductor device according to the design information.

45. The computer-readable tangible medium of claim 44, wherein the design information comprises a data file that comprises a GERBER format.

46. The computer-readable tangible medium of claim 44, wherein the design information comprises a data file that comprises a GDSII format.

47. The computer-readable tangible medium of claim 44, wherein the first length of the first load transistor and the second load transistor is at least twice as long as the second length of the representative core transistor.

48. The computer-readable tangible medium of claim 47, wherein the first length of the first load transistor and the second load transistor is at least three times as long as the second length of the representative core transistor.

49. The computer-readable tangible medium of claim 48, wherein a first width of the first load transistor and the second load transistor is about 400 nanometers and the first length of first load transistor and the second load transistor is about 145 nanometers.

50. The computer-readable tangible medium of claim 44, wherein the first load transistor and the second load transistor each have a first width that is wider than a second width of the representative core transistor.

51. The computer-readable tangible medium of claim 44, wherein the supply voltage comprises about 1 volt.

52. The computer-readable tangible medium of claim 44, further comprising implanting the first load transistor and the second load transistor with ion implantations to reduce the threshold voltage of the first load transistor and the second load transistor.

53. The computer-readable tangible medium of claim 44, further comprising creating one or more body bias inputs configured to receive a forward body bias to reduce the threshold voltage of the first load transistor and the second load transistor.

* * * * *

UNITED STATES PATENT AND TRADEMARK OFFICE
CERTIFICATE OF CORRECTION

PATENT NO. : 8,335,101 B2  Page 1 of 1
APPLICATION NO. : 12/691252
DATED : December 18, 2012
INVENTOR(S) : Seong-Ook Jung et al.

It is certified that error appears in the above-identified patent and that said Letters Patent is hereby corrected as shown below:

Title Page, Item [73], After the first assignee, add the following:

Industry-Academic Cooperation Foundation, Yonsei University, Seoul, Korea (KR)

To be listed as follows:

[73] Assignees: QUALCOMM Incorporated, San Diego, CA (US)
Industry-Academic Cooperation Foundation, Yonsei University, Seoul, Korea (KR)

Signed and Sealed this
Eighth Day of October, 2013

Teresa Stanek Rea
*Deputy Director of the United States Patent and Trademark Office*